(12) United States Patent
Kim et al.

(10) Patent No.: US 10,454,030 B2
(45) Date of Patent: Oct. 22, 2019

(54) DISPLAY DEVICE AND METHOD OF MANUFACTURING THE SAME

(71) Applicant: Samsung Display Co., Ltd., Yongin-si, Gyeonggi-do (KR)

(72) Inventors: Yang-Wan Kim, Yongin-si (KR); Won-Kyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 81 days.

(21) Appl. No.: 15/608,959

(22) Filed: May 30, 2017

(65) Prior Publication Data

US 2017/0263866 A1 Sep. 14, 2017

Related U.S. Application Data

(63) Continuation of application No. 14/609,360, filed on Jan. 29, 2015, now Pat. No. 9,666,814.

(30) Foreign Application Priority Data

Mar. 7, 2014 (KR) .................. 10-2014-0027428
May 27, 2014 (KR) .................. 10-2014-0063822

(51) Int. Cl.
*H01L 51/00* (2006.01)
*H01L 27/32* (2006.01)
*H01L 51/52* (2006.01)

(52) U.S. Cl.
CPC ...... *H01L 51/0001* (2013.01); *H01L 27/3246* (2013.01); *H01L 27/3258* (2013.01);
(Continued)

(58) Field of Classification Search
CPC . H01L 51/0001; H01L 51/0097; H01L 51/52; H01L 27/3246; H01L 27/3258;
(Continued)

(56) References Cited

U.S. PATENT DOCUMENTS 7,968,882 B2 6/2011 Lee et al.
8,933,451 B2 * 1/2015 Kim .................. H01L 27/3276
257/59

(Continued)

FOREIGN PATENT DOCUMENTS

CN 1429055 A 7/2003
CN 1612344 A 5/2005
(Continued)

OTHER PUBLICATIONS

EPO Search Report dated Jul. 29, 2015, for corresponding European Patent application 15157973.7, (7 pages).
(Continued)

*Primary Examiner* — Dzung Tran
(74) *Attorney, Agent, or Firm* — Lewis Roca Rothgerber Christie LLP

(57) ABSTRACT

A display device includes: a central area having a display area on a substrate; and a peripheral area around the central area; a plurality of pads arranged along one direction in the central area; a plurality of insulating patterns adjacent the plurality of pads; and a slit between the plurality of insulating patterns in the peripheral area, wherein the slit is formed by removing at least a portion of an insulating material of the plurality of insulating patterns.

33 Claims, 19 Drawing Sheets

(52) U.S. Cl.
CPC ...... *H01L 27/3276* (2013.01); *H01L 27/3288* (2013.01); *H01L 27/3297* (2013.01); *H01L 51/0097* (2013.01); *H01L 51/52* (2013.01); *H01L 2251/5338* (2013.01); *H01L 2251/566* (2013.01); *Y02E 10/549* (2013.01); *Y02P 70/521* (2015.11); *Y10T 428/24777* (2015.01)

(58) Field of Classification Search
CPC ............. H01L 27/3276; H01L 27/3288; H01L 27/3297; H01L 2251/5338; H01L 2251/566; Y10T 428/24777; Y02P 70/521; Y02E 10/549
USPC .......................................................... 257/40
See application file for complete search history.

(56) References Cited

U.S. PATENT DOCUMENTS

| | | | |
|---|---|---|---|
| 2003/0089991 A1 | 5/2003 | Yamazaki et al. | |
| 2003/0094895 A1 | 5/2003 | Okuyama et al. | |
| 2005/0023964 A1 | 2/2005 | Omura et al. | |
| 2005/0087742 A1 | 4/2005 | Chang et al. | |
| 2006/0033429 A1 | 2/2006 | Fujimura et al. | |
| 2007/0045841 A1* | 3/2007 | Cho | H01L 23/3171 257/737 |
| 2009/0140647 A1 | 6/2009 | Chung et al. | |
| 2009/0309489 A1 | 12/2009 | Takata et al. | |
| 2009/0311824 A1 | 12/2009 | Shin et al. | |
| 2011/0186844 A1 | 8/2011 | Koo | |
| 2011/0198572 A1 | 8/2011 | Park et al. | |
| 2013/0001563 A1* | 1/2013 | Park | H01L 27/3276 257/59 |
| 2013/0026476 A1 | 1/2013 | Park et al. | |
| 2013/0248826 A1 | 9/2013 | Kim et al. | |
| 2014/0211117 A1 | 7/2014 | Choi et al. | |

FOREIGN PATENT DOCUMENTS

| | | |
|---|---|---|
| CN | 102903856 A | 1/2013 |
| EP | 2 816 604 A2 | 12/2014 |
| KR | 10-0333271 B1 | 4/2002 |
| KR | 10-2002-0049941 A | 6/2002 |
| KR | 10-2005-0062797 A | 6/2005 |
| KR | 10-2005-0092598 A | 9/2005 |
| KR | 10-2009-0121894 A | 11/2009 |
| KR | 10-2013-0107116 A | 10/2013 |
| WO | WO 2014/126403 A1 | 8/2014 |

OTHER PUBLICATIONS

Korean Patent Abstracts Publication No. 10-2001-0008892 A, dated Feb. 5, 2001, for KR 10-0333271 B1, 1 page.
Chinese Office action with English Abstract dated Dec. 5, 2018 issued by the CNO for Chinese Patent Application No. 201510087922. 5, 8 pages.

* cited by examiner

DISPLAY DEVICE AND METHOD OF MANUFACTURING THE SAME

CROSS-REFERENCE TO RELATED APPLICATION

This application is a continuation of U.S. patent application Ser. No. 14/609,360, filed Jan. 29, 2015, which claims priority to and the benefit of Korean Patent Application No. 10-2014-0027428, filed Mar. 7, 2014 and Korean Patent Application No. 10-2014-0063822, filed on May 27, 2014, the entire content of all of which is incorporated herein by reference.

BACKGROUND

1. Field

One or more embodiments of the present invention relate to a display device and a method of manufacturing the same.

2. Description of the Related Art

In the display field, a display device using a flexible substrate that is light-weight and thin, and has excellent impact resistance is being developed. A display device using a flexible substrate may be manufactured by cutting a mother glass such that a plurality of display devices may be manufactured from a mother glass. For example, a display substrate may be cut along cutting lines by using a press to separate the substrate for individual display devices.

However, when the display substrate is cut by physical pressure, such as a press, regions around the cutting lines may be burred or distorted. Due to such a burr or distortion, layers on the display substrate may be detached or cracked, which may cause a line disconnection. Also, while cutting the display substrate, layers on the display substrate around the cutting lines may be separated, and thus reliability of the display device may deteriorate.

Accordingly, attempts to expose the display substrate by removing layers from the display substrate around the cutting lines have been made. However, when a remaining metal film exists in a stepped portion formed by removing the layers around the cutting lines, a short may be generated as the remaining metal films are electrically coupled to lines included in a circuit board on which an external circuit is mounted while coupling the circuit board to pads formed in the display substrate.

SUMMARY

One or more embodiments of the present invention include a display device using a flexible substrate, and a method of manufacturing the same.

One or more embodiments of the present invention relate to a display device using a flexible substrate, and a method of manufacturing the same.

Additional aspects will be set forth in part in the description which follows and, in part, will be apparent from the description, or may be learned by practice of the presented embodiments.

According to one or more embodiments of the present invention, a display device includes: a central area having a display area on a substrate; a peripheral area around the central area; a plurality of pads arranged along one direction in the central area; a plurality of insulating patterns adjacent the plurality of pads; and a slit between the plurality of insulating patterns in the peripheral area, wherein the slit is formed by removing at least a portion of an insulating material of the plurality of insulating patterns.

The plurality of pads may each include an extension line, and the plurality of insulating patterns may overlap the extension lines.

The plurality of insulating patterns may include an inorganic material.

The display device may further include an organic film covering an uppermost surface and at least one region of a side surface of the plurality of insulating patterns.

The peripheral area may include a region exposing a top surface of the substrate.

The peripheral area may include a pad peripheral area adjacent to the plurality of pads and comprises the plurality of insulating patterns and the slit, and the region exposing the top surface of the substrate may be adjacent to the pad peripheral area.

The region exposing the top surface of the substrate may be adjacent to an edge of the substrate.

An edge of the substrate may be defined by a cutting line.

At least one inorganic film may be in a central area of the substrate.

The plurality of insulating patterns may have a shape coupled to the at least one inorganic film.

The plurality of pads may be on the at least one inorganic film.

The at least one inorganic film may include a plurality of layers.

The plurality of insulating patterns may include a plurality of inorganic patterns stacked on each other.

The plurality of insulating patterns may include a first inorganic pattern, and a second inorganic pattern on the first inorganic pattern.

A top surface of the first inorganic pattern may be completely covered by the second inorganic pattern.

A top surface of the first inorganic pattern may have an exposed region.

The display device may further include an organic film covering at least a top surface and a side surface of the second inorganic pattern of the plurality of insulating patterns.

A first inorganic film may be between the plurality of insulating patterns and the substrate.

A groove may be formed in a region of the first inorganic film that is removed such that a groove is formed in a region of the first inorganic film overlapping the slit.

The display device may further include an organic film covering at least a top surface and a side surface of the plurality of insulating patterns while not covering a portion of the first inorganic film corresponding to the slit.

The display device may further include, in the central area: a buffer film on the substrate; and a plurality of thin-film transistors (TFTs) on the buffer film and comprising an active layer, a gate electrode, a source electrode, and a drain electrode, and at least one insulating film may be adjacent to at least one of the active layer, the gate electrode, the source electrode, and the drain electrode, and the plurality of insulating patterns may be a same material as the at least one insulating film.

The plurality of insulating patterns and the at least one insulating film may be coupled to each other.

The at least one insulating film may include at least one of a buffer film formed on the substrate, a gate insulating layer insulating the gate electrode and an active layer, or an interlayer dielectric film insulating the source and drain electrodes and the gate electrode.

The at least one insulating film may include at least one of a buffer film formed on the substrate, a gate insulating layer insulating the gate electrode and an active layer, or a passivation film formed on the source and drain electrodes.

The display device may further include an organic film covering the plurality of TFTs, wherein the organic film covers at least one region of an uppermost surface and a side surface of the plurality of insulating patterns.

The display device may further include: a pixel electrode electrically coupled to at least one of the plurality of TFTs; and a pixel-defining film covering a portion of the pixel electrode and defining an emission region, wherein the pixel-defining film covers at least one region of an uppermost surface and a side surface of the plurality of insulating patterns.

The display device may further include a counter electrode facing the pixel electrode, and an organic emission layer may be between the pixel electrode and the counter electrode.

The substrate may include a flexible material.

The display device may further include: dummy insulating patterns spaced apart from the plurality of insulating patterns, wherein the dummy insulating patterns do not correspond to the plurality of pads; and a dummy slit between the dummy insulating patterns, wherein a portion of the dummy insulating patterns is removed in the peripheral area to form the dummy slit.

An angle formed by an extension line of the plurality of pads and an edge of the substrate may be smaller or larger than 90° such that the plurality of pads have a slant shape, and an angle formed by an extension line of the slit and the edge of the substrate may be smaller or larger than 90° such that the slit has a slant shape.

The angle formed by the extension line of the plurality of pads and the edge of the substrate may be the same as the angle formed by the extension line of the slit and the edge of the substrate.

The display device may further include a circuit board on which an external circuit is mounted such that an electric signal is transmitted to the display area, and a plurality of wires of the circuit board may be coupled to the plurality of pads.

The plurality of wires of the circuit board may be on the plurality of insulating patterns, and may be spaced apart from the slit.

According to some embodiments of the present invention, in a method of manufacturing a display device, the display device including a central area having a display area on a substrate, and a peripheral area around the central area, the method includes: forming, in the central area, a plurality of pads along one direction; forming, in a region of the peripheral area adjacent to the plurality of pads, a plurality of insulating patterns corresponding to the plurality of pads; and forming a slit between the plurality of insulating patterns by a portion of an insulating material of the plurality of insulating patterns.

The method may further include forming an inorganic film in a central area of the substrate, and the plurality of insulating patterns may include the inorganic film.

The at least one inorganic film may include a plurality of layers.

The method may further include: forming the plurality of insulating patterns spaced apart from each other across the slit by patterning a layer comprising at least an uppermost layer from among the plurality of layers of the inorganic film; and after forming the plurality of insulating patterns, forming the plurality of pads on any one of the plurality of layers of the inorganic film.

The method may further include, after forming the plurality of pads, removing a layer comprising at least a lowermost layer of the plurality of layers of the inorganic film, in a region corresponding to the slit.

The peripheral area may include a region exposing a top surface of the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
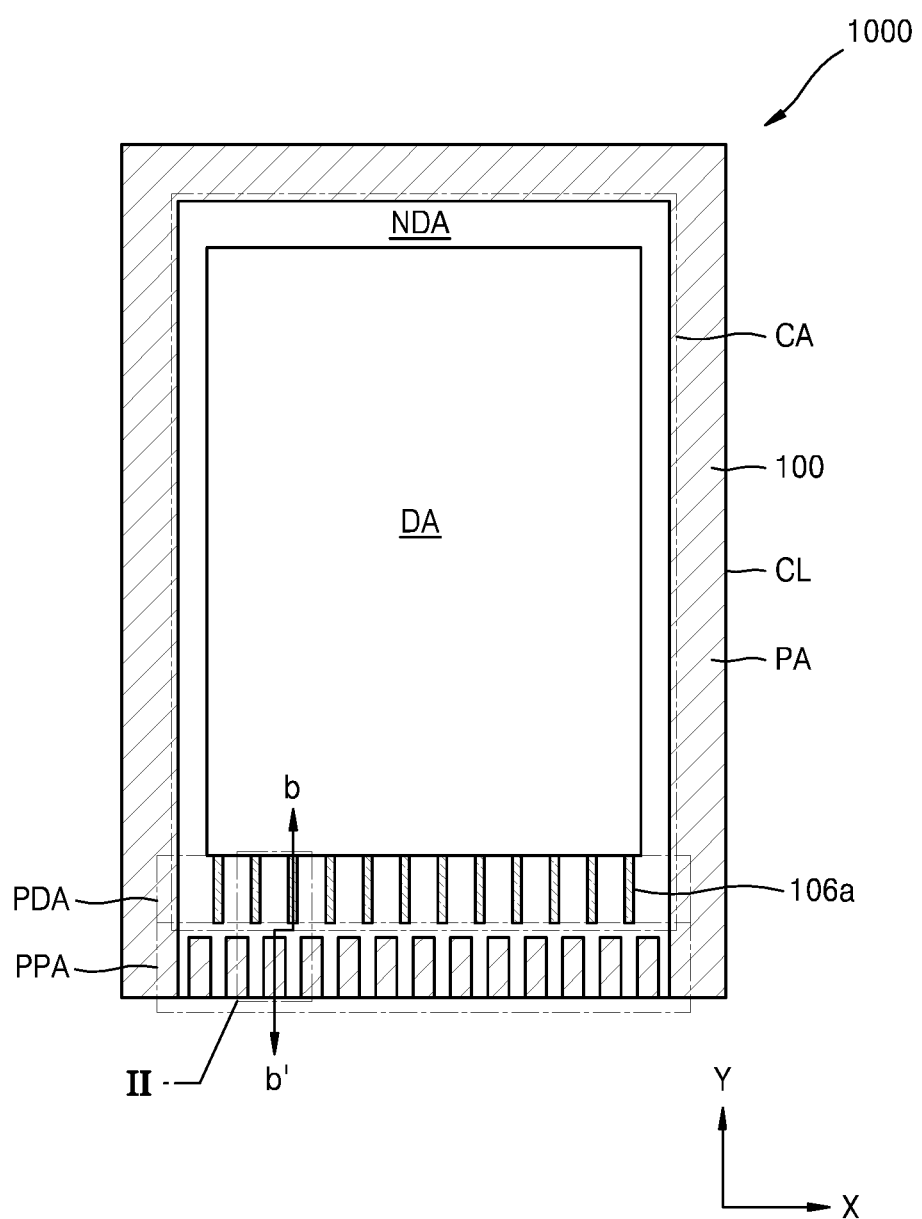
FIG. 1 is a plan view schematically illustrating a display device according to an embodiment of the present invention.

Reference will now be made in some detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "include" and/or "including" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 2:
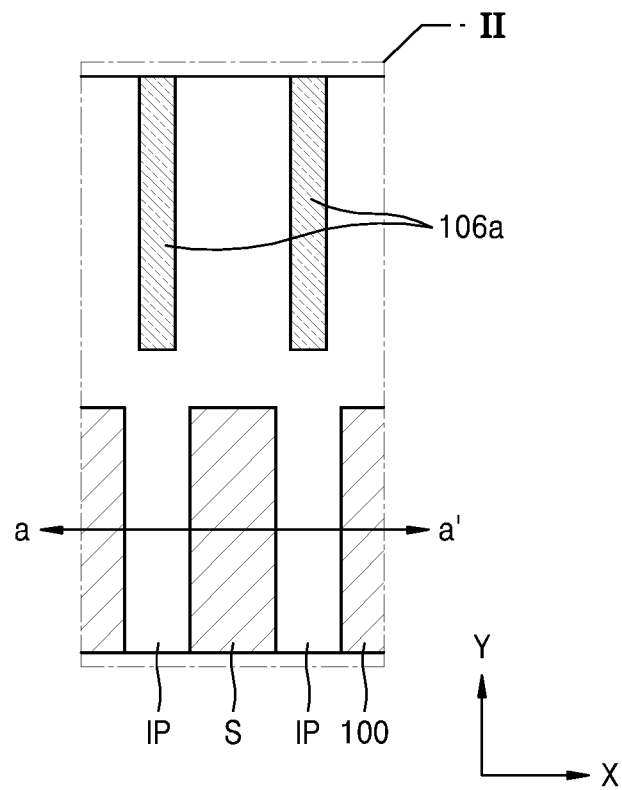
FIG. 2 is an enlarged plan view of the region II of FIG. 1.
Figure 3:
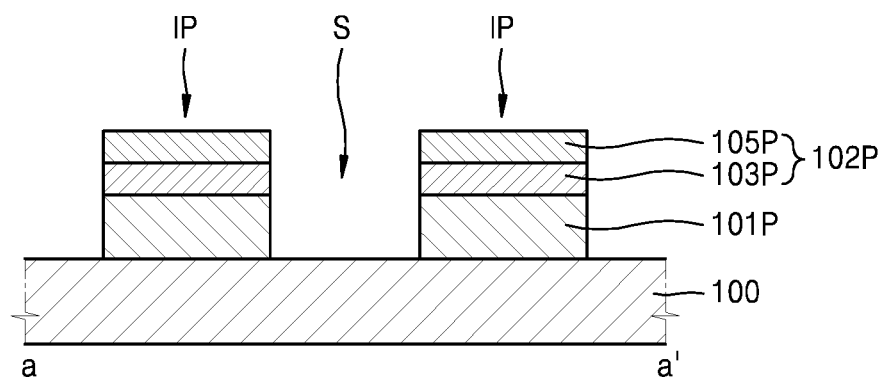
FIG. 3 is a cross-sectional view taken along the line a-a' of FIG. 2, according to an embodiment of the present invention.

FIG. 1 is a plan view schematically illustrating a display device 1000 according to an embodiment of the present invention. FIG. 2 is an enlarged plan view of the region II of FIG. 1, and FIG. 3 is a cross-sectional view taken along the line a-a' of FIG. 2, according to an embodiment of the present invention.

Referring to FIG. 1, the display device 1000 includes a substrate 100, according to some embodiments. The substrate 100 may be formed of any suitable substrate material, for example, the substrate 100 may be formed of glass, a metal, or another organic material.

In some embodiments, the substrate 100 may be formed of a flexible material such that the substrate 100 may be a flexible substrate that is easily bent, curved, folded, or rolled. For example, the substrate 100 may be formed of ultra-thin glass, metal, or plastic. When plastic is used, the substrate 100 may be formed, for example, of polyimide (PI), but a material of the substrate 100 is not limited thereto and may vary to include any other suitable flexible substrate material.

A plurality of the display devices 1000 may be formed on a mother glass, and an individual display device 1000 may be obtained by cutting the substrate 100 along a cutting line CL. FIG. 1 illustrates the individual display device 1000 separated by cutting the substrate 100 along the cutting line CL. Accordingly, an edge of the substrate 100 is defined by the cutting line CL.

The substrate 100 is divided into a peripheral area PA and a central area CA. The peripheral area PA is an area around or adjacent the cutting line CL, and the central area CA is an area inside the peripheral area PA.

However, the current embodiment is not limited thereto. For example, the cutting line CL may not exist. In other words, one display device 1000 may be formed in one mother glass, and in this case, the substrate 100 may be the one mother glass, and thus there may be no cutting line CL. At this time, the peripheral area PA is an area adjacent to an edge of the substrate 100, and the central area CA may be an area inside the peripheral area PA. For convenience of description, one or more embodiments described hereinafter include the cutting line CL.

The central area CA includes a display area DA and a non-display area NDA.

The display area DA may include at least one display element for displaying an image, for example, at least one organic light-emitting device (OLED). Also, the display area DA may include a plurality of pixels.

The non-display area NDA is located around the display area DA. As shown in FIG. 1, the non-display area NDA may be formed to surround the display area DA. Although not illustrated, in some embodiments, the non-display area NDA may be formed adjacent to a plurality of side surfaces of the display area DA. In some embodiments, the non-display area NDA may be formed adjacent to a side surface of the display area.

The non-display area NDA includes at least a pad area PDA.

A driver or a plurality of pads 106a are arranged in the pad area PDA.

In some embodiments, at least one inorganic film may be formed in the central area CA so as to prevent moisture or impurities from penetrating into the display device 1000 through the substrate 100.

The peripheral area PA is an area around the cutting line CL, and located on a circumference of the substrate 100 along the cutting line CL.

At least one region of the peripheral area PA includes a region where a top surface of the substrate 100 is exposed, and a pad peripheral area PPA.

First, the region of the peripheral area PA where the top surface of the substrate 100 is exposed will be described.

As shown in FIG. 1, the peripheral area PA may include the region where the top surface of the substrate 100 is exposed at regions near an upper edge, a left edge, and a right edge of the substrate 100.

The region of the peripheral area PA where the top surface of the substrate 100 is exposed prevents a crack from spreading by an insulating film, for example, inorganic films on the substrate 100, while cutting and separating the individual display device 100 from a mother glass.

A width of the region of the peripheral area PA where the top surface of the substrate 100 is exposed may range from about several micrometers to hundreds of micrometers, from the cutting line CL to the central area CA. For example, the width may range from 40 to 500 micrometers, or from 50 to 350 micrometers.

In some embodiments, the peripheral area PA may not include the region where the top surface of the substrate 100 is exposed. In other words, the peripheral area PA may only include the pad peripheral area PPA that is described below, and may not expose the top surface of the substrate 100 at a region near the edge of the substrate 100.

The pad peripheral area PPA of the peripheral area PA will now be described.

The pad peripheral area PPA is a region adjacent to the pad area PDA from the peripheral area.

Figure 32:
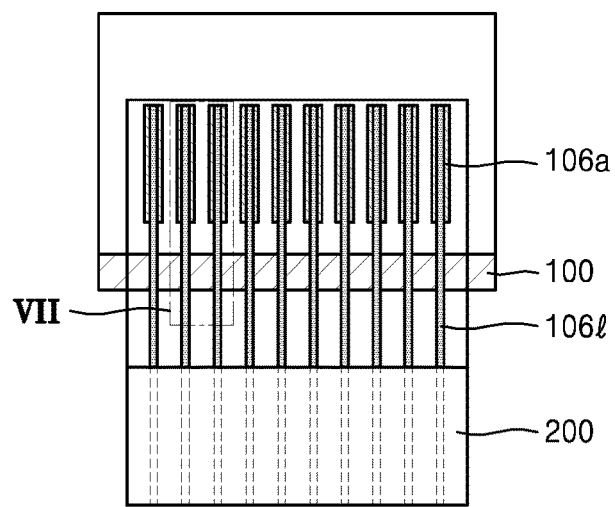
FIG. 32 is a plan view schematically illustrating a display device according to a comparative example.

In some embodiments, assuming that a circuit board 200 of FIG. 32 on which an external circuit is mounted, for example a chip-on-film (COF), is bonded to the pad 106a, the pad peripheral area PPA may be an area overlapped by the circuit board 200.

The pad peripheral areas PPA are located correspondingly to at least the plurality of pads 106a.

The pad peripheral area PPA includes an insulating pattern IP. The insulating patterns IP are arranged correspondingly to the pads 106a, and are spaced apart from each other across a slit S.

The insulating pattern IP is arranged to overlap an extension line of the pad 106a. Accordingly, when a wire of a circuit board is coupled to the pad 106a, the wire is arranged on a top surface of the insulating pattern IP, and thus the wire is prevented (or substantially prevented) from contacting an impurity on the substrate 100, for example, a remaining metal film or a metal particle, thereby preventing (or substantially preventing) instances of a short circuit.

In some embodiments, an effect of preventing a short circuit may be increased by disposing the extension line of the pad 106a to be spaced apart from the slit S.

Such an effect will be described in more detail later with reference to accompanying drawings.

In FIGS. 2 and 3, the insulating pattern IP located in the pad peripheral area PPA is described in more detail.

FIG. 2 illustrates a portion of the pad area PDA where the pad 106a is located, and a portion of the pad peripheral area PPA adjacent to the pad area PDA. The plurality of pads 106a are formed on the substrate 100.

Here, as described above, in some embodiments, at least one inorganic film may be formed in the central area CA on the substrate 100, and at this time, the inorganic film may be formed in the pad area PDA, or the pad 106a may be formed on the inorganic film of the pad area PDA.

The pads 106a are arranged in one direction while being spaced apart from each other at predetermined intervals. In some embodiments, the pads 106a may be arranged in a width direction (an x-axis direction of FIG. 2) of each pad 106a.

The plurality of insulating patterns IP are arranged in the pad peripheral area PPA. As described above, in some embodiments, at least one inorganic film may be formed in the central area CA on the substrate 100, and at this time, the plurality of insulating patterns IP may be coupled to the inorganic film of the pad area PDA. However, the current embodiment is not limited thereto, and the insulating pattern IP may be formed separately from the inorganic film formed in the central area CA.

The insulating patterns IP may be arranged in a row in a direction corresponding to the plurality of pads 106a. The insulating patterns IP may be formed of an inorganic material. When the insulating pattern IP is coupled to the at least one inorganic film formed in the central area CA according to some embodiments described above, the insulating patterns IP protrude from the pad area PDA towards the pad peripheral area PPA, and are respectively arranged at locations corresponding to the plurality of pads 106a. In other words, each insulating pattern IP is located at a location where each pad 106a extends in a length direction (a y-direction of FIG. 2).

The slit S is arranged between the adjacent insulating patterns IP, and the insulating patterns IP are spaced apart from each other across the slit S. Here, the slit S may be a narrow and long slit, and may be a type of opening that exposes a top surface of the substrate 100 or a type of opening that exposes an inorganic film having a top surface lower than that of the insulating pattern IP according to one or more embodiments that will be described later.

Referring to FIG. 3, the slit S is a type of opening that exposes the top surface of the substrate 100. In FIG. 3, the insulating patterns IP are spaced apart from each other across the slit S that exposes the top surface of the substrate 100.

The insulating pattern IP sequentially includes, from the substrate 100, a first inorganic pattern 101P and a second inorganic pattern 102P. The second inorganic pattern 102P has a structure in which a plurality of inorganic pattern layers 103P and 105P are stacked on each other. The insulating pattern IP shown in FIG. 3 is only an example, and thus the current embodiment is not limited thereto and may include the insulating pattern IP having any structure. For example, the insulating pattern IP may include only one layer, two layers, or at least four layers.

Also, as described above, in some embodiments, at least one inorganic film may be formed in the central area CA on the substrate 100, and at this time, the plurality of insulating pads IP may be coupled to an inorganic film of the pad area PDA.

In other words, the first and second inorganic patterns 101P and 102P that are sequentially stacked in the insulating pattern IP may be respectively coupled to inorganic films that are sequentially formed in the pad area PDA.

Also, in some embodiments, various inorganic films may be formed in the display area DA of the central area CA. In other words, the plurality of insulating pads IP may be formed to be coupled to at least one of a buffer film adjacently formed on the substrate 100, and a gate insulating layer, an interlayer dielectric film, a passivation film, and other various insulating films, which may be included in a thin-film transistor (TFT) for driving a pixel.

The first inorganic pattern 101P may be arranged in the central area CA to flatten the top surface of the substrate 100, and may include a pattern of a buffer film operating as a barrier so as to prevent (or substantially prevent) moisture or impurity penetration through the substrate 100. Also, the second inorganic pattern 102P may be arranged in the central area CA, and may include the inorganic pattern layer 103P of a gate insulating layer for insulating an active later and a gate electrode of a TFT from each other, and the inorganic pattern layer 105P of an interlayer dielectric film for insulating the gate electrode and source and drain electrodes from each other. Details thereof will be described later.

In an embodiment of FIG. 3, the insulating pattern IP has a side end surface in which a top surface of the first inorganic pattern 101P is completely covered by the second inorganic pattern 102P. In other words, a side end surface of the first inorganic pattern 101P and a side end surface of the second inorganic pattern 102P may be located on the same line.

However, FIG. 3 is only an example and the current embodiment may have various modified examples. For example, a side end surface of the first inorganic pattern 101P and a side end surface of the second inorganic pattern 102P may be located on the same inclined line. As another example, the side end surface of the first inorganic pattern 101P and the side end surface of the second inorganic pattern 102P may not be located on the same line. In some cases, a width of the first inorganic pattern 101P may be smaller than that of the second inorganic pattern 102P.

Figure 4:
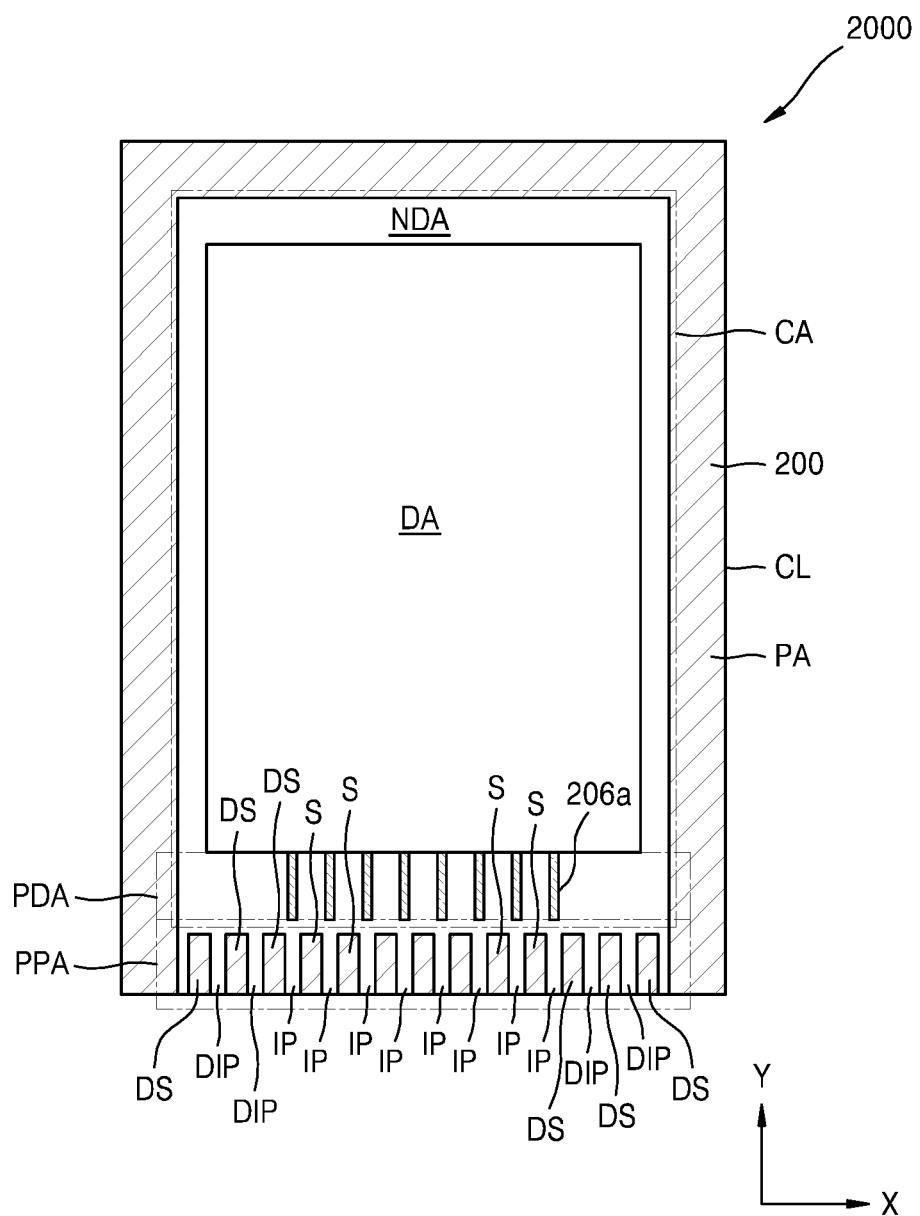
FIG. 4 is a plan view schematically illustrating a display device according to another embodiment of the present invention.

FIG. 4 is a plan view schematically illustrating a display device 2000 according to another embodiment of the present invention.

The display device 2000 according to the current embodiment includes a peripheral area PA and a central area CA on a substrate 200, wherein the central area CA includes a display area DA and a non-display area NDA, and the peripheral area PA includes at least a pad peripheral area PPA.

For convenience of description, differences between the display devices 1000 and 2000 will be mainly described.

The pad peripheral area PPA includes insulating patterns IP and dummy insulating patterns DIP.

The insulating patterns IP are formed correspondingly to pads 206a, and are spaced apart from each other across a slit S.

The dummy insulating patterns DIP do not correspond to the pads 206a, and are spaced apart from each other across a dummy slit DS.

The insulating pattern IP is arranged to overlap an extension line of the pad 206a. Accordingly, when a wire is coupled to the pad 206a, the wire is prevented (or substantially prevented) from contacting an impurity or contaminants, such as remaining metal film or metal particles, on the substrate 200, thereby blocking or reducing instances of a short circuit.

The dummy insulating pattern DIP may cover impurities or particles remaining while forming various components on the substrate 200, and thus a defect caused by the impurities may be prevented or substantially prevented. Also, the dummy insulating pattern DIP and the dummy slit DS may perform a stress relief function when the display device 2000 including the substrate 200 is deformed, for example, bent or folded.

Because other components of the display device 2000 are substantially similar those of the display device 2000 described above, some further details about the display device 2000 will not be repeated.

FIGS. 5 through 14 are cross-sectional views taken along the line a-a' of FIG. 2, according to other embodiments of the present invention.

Figure 5:
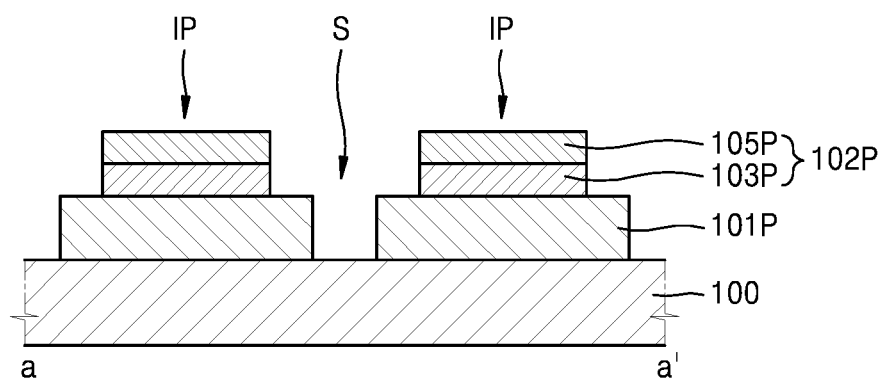
FIGS. 5 through 14 are cross-sectional views taken along the line a-a' of FIG. 2, according to other embodiments of the present invention.

According to an embodiment of FIG. 5, the slit S is a type of opening that exposes the top surface of at least the substrate 100. In the embodiment of FIG. 5, the insulating pattern IP is spaced apart from each other across the slit S that exposes the top surface of at least the substrate 100.

Meanwhile, like an embodiment of FIG. 3, the insulating pattern IP includes the first inorganic pattern 101P and the second inorganic pattern 102P sequentially from the substrate 100. As described above, in some embodiments, at least one inorganic film may be formed in the central area CA on the substrate 100, and at this time, the plurality of insulating patterns IP may be coupled to the inorganic film in the pad area PDA. However, the current embodiment is not limited thereto, and the insulating pattern IP may be formed separately from the inorganic film in the central area CA.

Examples of forming the first and second inorganic patterns 101P and 102P have been described above. In other words, the above-described embodiments may be applied to details about connection relationships with the inorganic films in the central area CA.

Also, the second inorganic pattern 102P may have a structure in which the plurality of inorganic pattern layers 103P and 105P are stacked on each other.

Unlike an embodiment of FIG. 3, the top surface of the first inorganic pattern 101P of the insulating pattern IP is partially exposed in an embodiment of FIG. 5. In other words, the side end surface of the first inorganic pattern 101P and the side end surface of the second inorganic pattern 102P are not located on the same line, and the second inorganic pattern 102P only covers a part of the top surface of the first inorganic pattern 101P.

In an embodiment of FIG. 5, a remaining metal film may be left on a region where the top surface of the first inorganic pattern 101P is exposed, but a short circuit of the pad unit 106a may be prevented.

Figure 6:
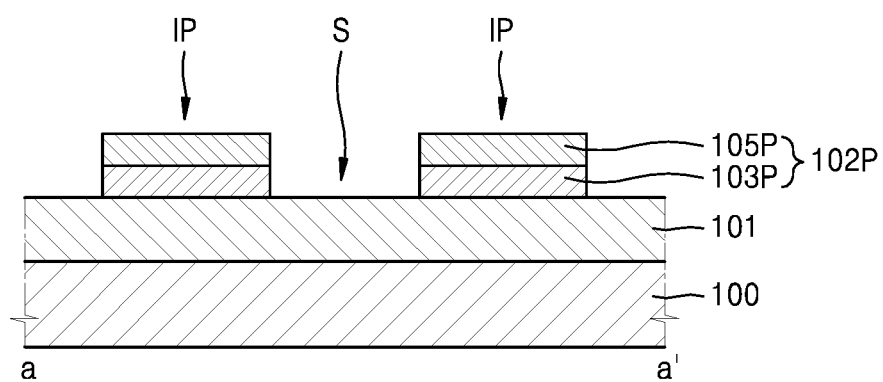

Referring to an embodiment of FIG. 6, the slit S is a type of opening that exposes a top surface of a first inorganic film 101. In an embodiment of FIG. 6, the insulating patterns IP are spaced apart from each other across the slit S that exposes the top surface of the first inorganic film 101.

Meanwhile, the insulating pattern IP includes the second inorganic pattern 102P on the first inorganic film 101. As described above, in some embodiments, at least one inorganic film may be formed in the central area CA on the substrate 100, and at this time, the plurality of insulating patterns IP may be coupled to the inorganic films in the pad area PDA. However, the current embodiment is not limited thereto, and the insulating patterns IP may be formed separately from the inorganic films in the central area CA.

Detailed examples of forming the second inorganic pattern 102P have been described above. In other words, the above-described embodiments may be applied to details about coupling relationships with the inorganic films in the central area CA. Also, the second inorganic pattern 102P may have a structure in which the plurality of inorganic pattern layers 103P and 105P are stacked on each other.

In an embodiment of FIG. 6, the first inorganic film 101 is formed in the pad peripheral area PPA and the insulating pattern IP only includes the second inorganic pattern 102P, and thus an operation of patterning the first inorganic film 101 may be omitted, thereby simplifying processes.

Figure 7:
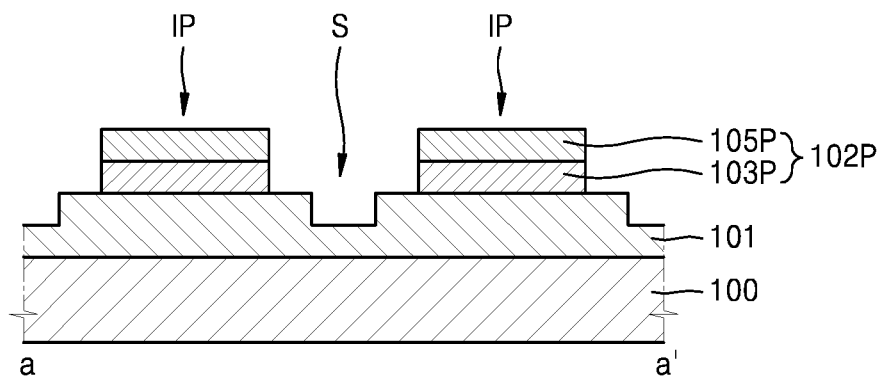

Referring to an embodiment of FIG. 7, the slit S is a type of opening that exposes the top surface of the first inorganic film 101. In an embodiment of FIG. 7, the insulating pattern IP is spaced apart from each other across the slit S that exposes the top surface of the first inorganic film 101.

Meanwhile, the insulating pattern IP includes the second inorganic pattern 102P on the first inorganic film 101. As described above, in some embodiments, at least one inorganic film may be formed in the central area CA on the substrate 100, and at this time, the plurality of insulating patterns IP may be coupled to the inorganic films in the pad area PDA. However, the current embodiment is not limited thereto, and the insulating patterns IP may be formed separately from the inorganic films formed in the central area CA.

Detailed examples of forming the second inorganic pattern 102P have been described above. In other words, the above-described embodiments may be applied to details about coupling relationships with the inorganic films in the central area CA. Also, the second inorganic pattern 102P may have a structure in which the plurality of inorganic pattern layers 103P and 105P are stacked on each other.

In an embodiment of FIG. 7, the first inorganic film 101 has a groove (e.g., a predetermined groove) between the second inorganic patterns 102P. Such a groove (e.g., a predetermined groove) may have any one of various shapes, and as shown in FIG. 7, may have a boundary line spaced apart from the second inorganic pattern 102P.

However, the current embodiment is not limited thereto. In other words, as shown in FIG. 8, the boundary line of the groove (e.g., the predetermined groove) of the first inorganic film 101 may be coupled to a side surface of the second inorganic pattern 102P.

Alternatively, the groove (e.g., the predetermined groove) may be formed in the first inorganic film 101 in any one of other various shapes, for example, the boundary line of the groove (e.g., the predetermined groove) of the first inorganic film 101 may be formed to pass over the side surface of the second inorganic pattern 102P.

Figure 8:
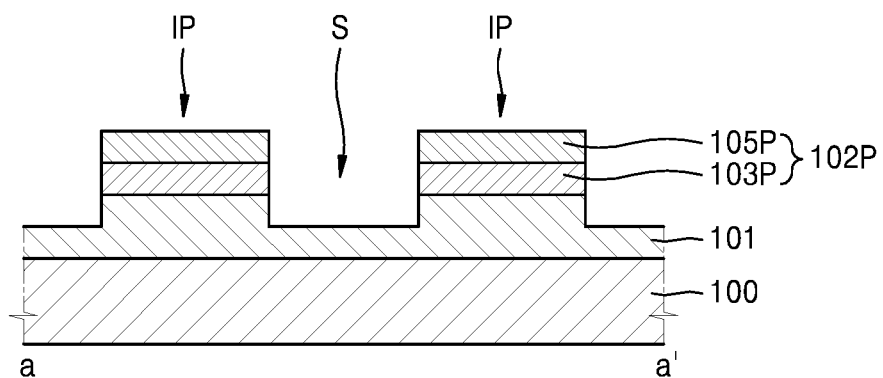

In embodiments of FIGS. 7 and 8, the top surface of the first inorganic film 101 where the slit S is located is partially removed. Accordingly, a thickness of the first inorganic film 101 corresponding to the slit S in a region (e.g., a predetermined region) is thinner than a thickness of the first inorganic film 101 corresponding to the insulating pattern IP.

According to embodiments of FIGS. 9 through 14, an organic film 107P for covering the insulating pattern IP is further included compared to embodiments of FIGS. 3 and 5 through 6.

Figure 9:
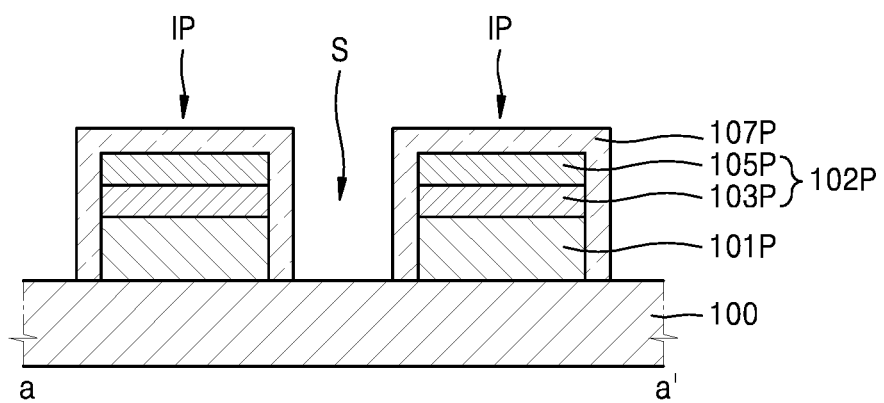
Figure 10:
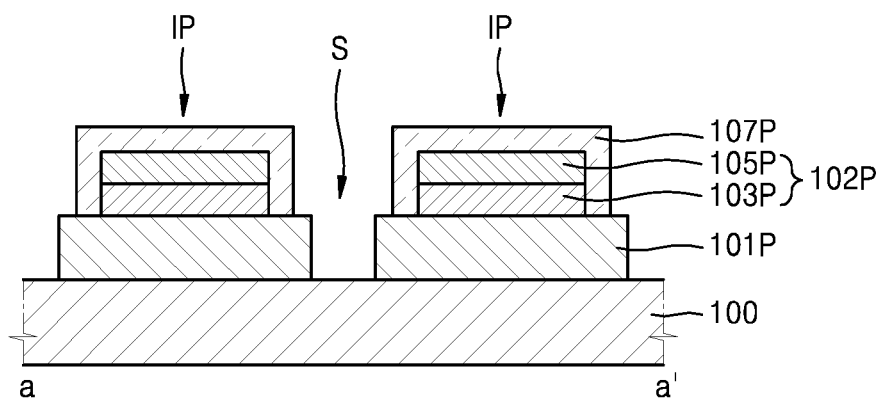
Figure 11:
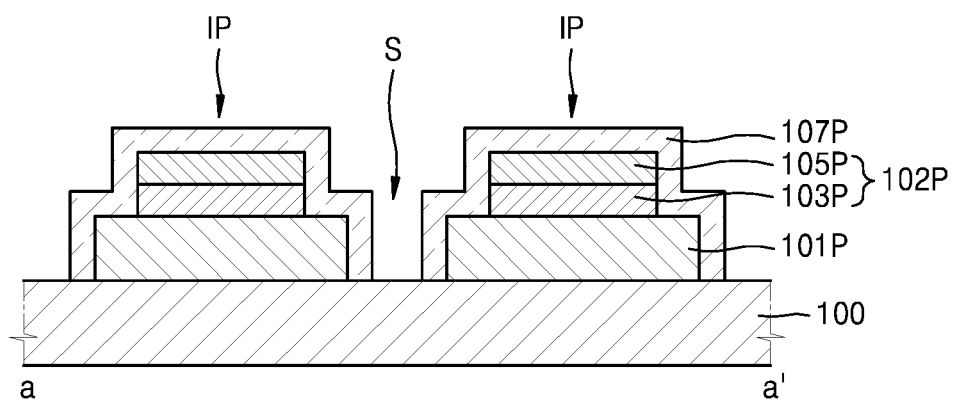

Referring to FIG. 9, the organic film 107P covering the top and side surfaces of the insulating pattern IP is further included compared to an embodiment of FIG. 3, and referring to FIG. 10, the organic film 107P covering the top and side surfaces of the second inorganic pattern 102P included in the insulating pattern IP is further included compared to an embodiment of FIG. 5. Referring to FIG. 11, the organic film 107P covering the top and side surfaces of the first and second inorganic patterns 101P and 102P included in the insulating pattern IP is further included compared to an embodiment of FIG. 5.

Figure 12:
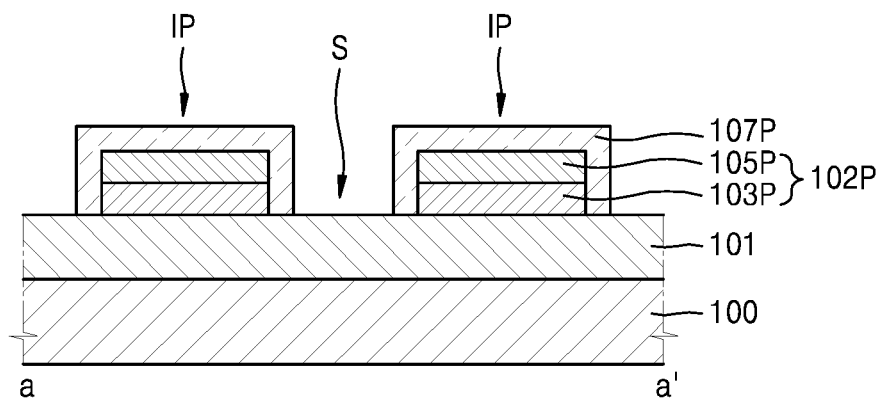
Figure 13:
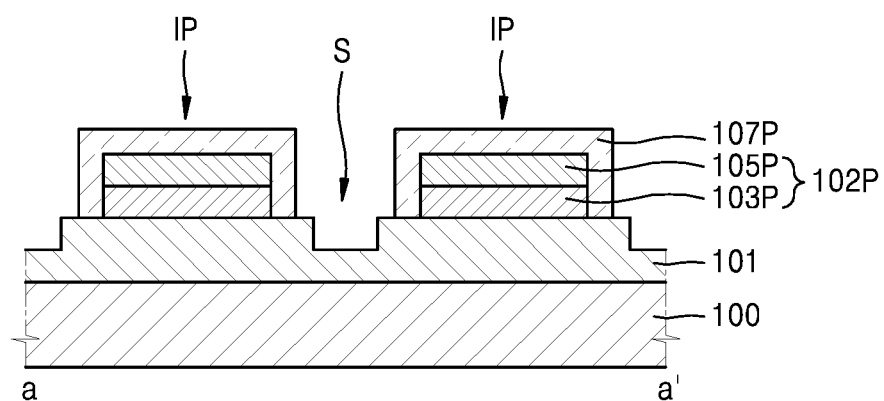

Referring to FIG. 12, the organic film 107P covering the top and side surfaces of the second inorganic pattern 102P included in the insulating pattern IP is further included compared to an embodiment of FIG. 6. Referring to FIG. 13, the organic film 107P covering the top and side surfaces of the second inorganic pattern 102P included in the insulating pattern IP is further included compared to an embodiment of FIG. 7.

Figure 14:
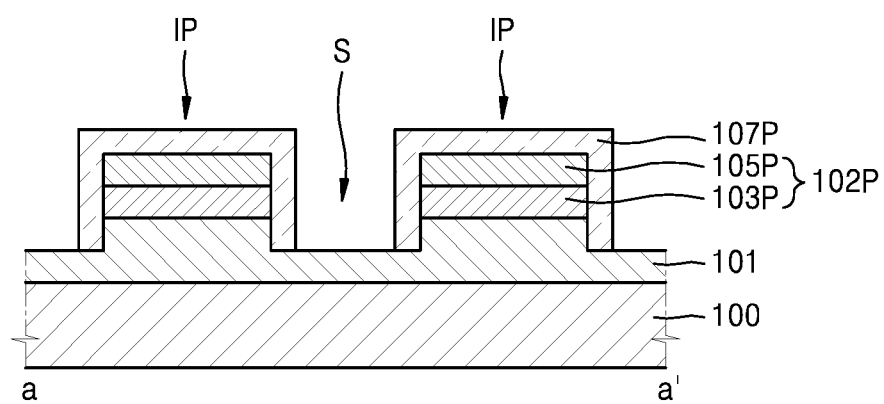

Referring to FIG. 14, the organic film 107P covering the top and side surfaces of the second inorganic pattern 102P included in the insulating pattern IP is further included compared to an embodiment of FIG. 8.

In some embodiments, the organic film 107P may be formed to be coupled to at least one organic film included in the central area CA. For example, the organic film 107P may be located in the central area CA to cover a TFT, and may be coupled to a passivation film that flattens unevenness caused by the TFT. According to another embodiment, the organic film 107P may be coupled to a pixel-defining film for defining an emission region by covering a part of a pixel electrode located on a passivation film. In other words, while forming a passivation film or a pixel-defining film in the central area CA, the organic film 107P may be formed together so as not to have to perform an additional process.

According to embodiments of FIGS. 9 through 14, even when a remaining metal film is left on the side surface of the second inorganic pattern 102P, the organic film 107P covers the remaining metal film, and thus a short circuit generated by the remaining metal film may be prevented.

Figure 15:
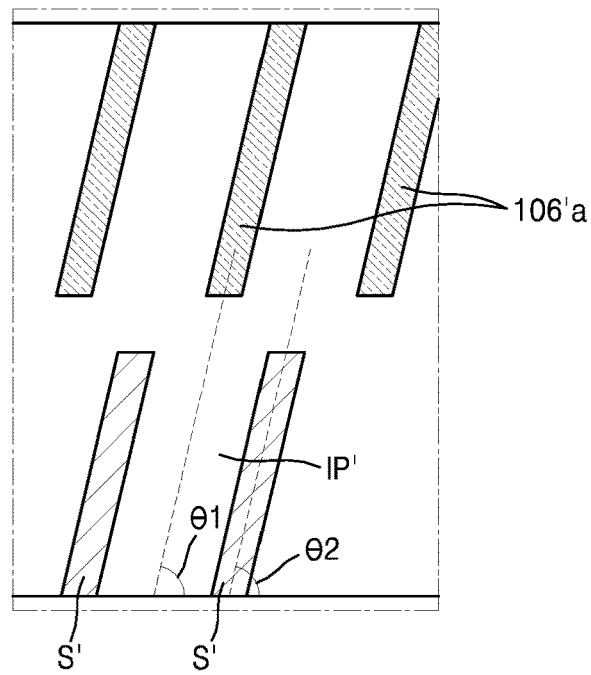
FIGS. 15 and 16 are enlarged plan views of modified examples of FIG. 2.
Figure 16:
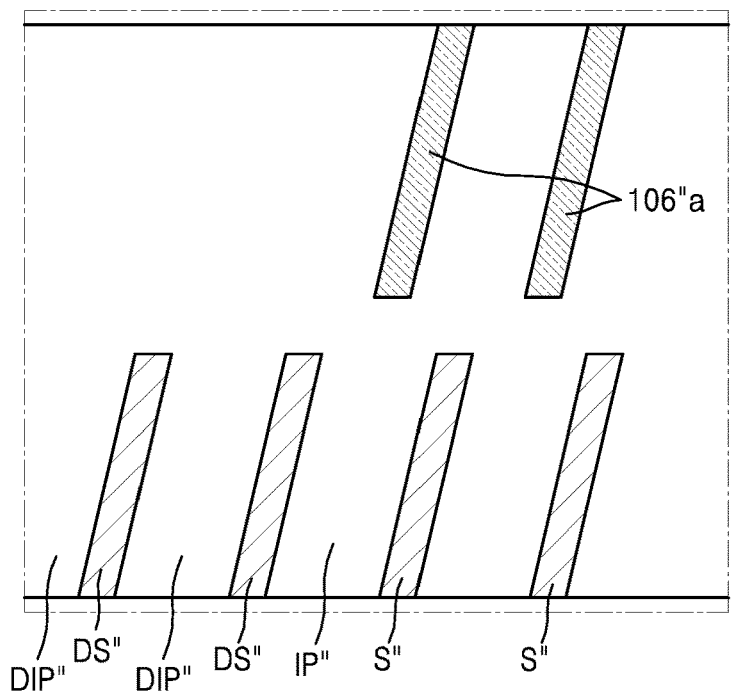

FIGS. 15 and 16 are enlarged plan views of modified examples of FIG. 2. For convenience of description, only differences from the above-described embodiments will be mainly described.

Referring to FIG. 15, a plurality of pads 106'*a* have inclined shapes. For example, an angle $\theta_1$ formed by an extension line of the pad 106'*a*, for example, a center line of the pad 106'*a*, and an edge of a substrate may be smaller than 90°. Also, an angle $\theta_2$ formed by a boundary line of a slit S', for example, a center line of the slit S', and the edge of the substrate may be smaller than 90°.

In some embodiments, the angles $\theta_1$ and $\theta_2$ may be the same. Accordingly, the pad 106'*a* and the insulating pattern IP are formed in parallel.

In other embodiments, however, the inclined shapes of the plurality of pads 106'*a* may vary. In other words, the angle $\theta_1$ may be larger than 90°. In this case, the angle $\theta_2$ may also be larger than 90°.

Alternatively, the inclined shapes of the plurality of pads 106'*a* formed in one region of the substrate and the inclined shapes of the plurality of pads 106'*a* formed in another region of the substrate may be different from each other. In other words, a plurality of the angles $\theta_1$ may exist on one substrate.

Alternatively, as shown in FIG. 16, dummy insulating patterns DIP" and dummy slits DS" may be further formed together with a plurality of pads 106"*a* and a plurality of slits 5". The dummy insulating patterns DIP" do not correspond to the pads 106*a*", and are spaced apart from each other across the dummy slits DS".

Inclined shapes of the pads 106"*a* and slits 5" are the same as those of FIG. 15, and thus details thereof are not repeated.

Here, like the slits 5", the dummy slits 5" have inclined shapes.

FIGS. 17 through 25 are cross-sectional views for describing a method of manufacturing the display device 1000 of FIG. 1 based on a line b-b' of FIG. 1, according to an embodiment of the present invention. A process of manufacturing the insulating pattern IP according to an embodiment of FIG. 3 is included.

Figure 17:
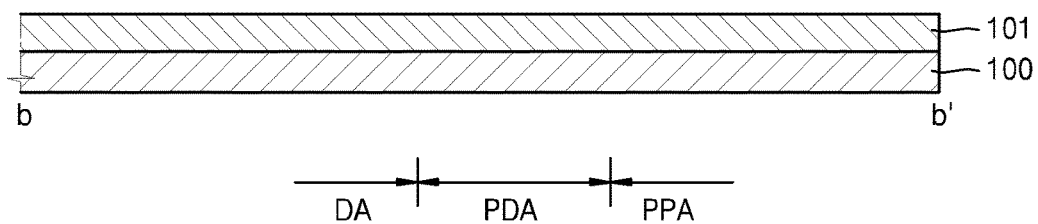
FIGS. 17 through 25 are cross-sectional views for describing a method of manufacturing the display device of FIG. 1 based on the line b-b' of FIG. 1, according to an embodiment of the present invention.

Referring to FIG. 17, the substrate 100 is prepared first. The substrate 100 may be formed of any one of various materials, and in some embodiments, may be formed of a flexible material as described above. The first inorganic film 101 is formed on the substrate 100. The first inorganic film 101 may be functionally a buffer film, wherein the buffer film is formed on all of the central area CA of the substrate 100 including the display area DA, the non-display area NDA, and the pad area PDA, and the peripheral region PA around the cutting line CL including the pad peripheral area PPA. In other words, the buffer film may be formed on the entire top surface of the substrate 100. Here, the substrate 100 may be the substrate 100 where one display device 1000 is to be formed, or a mother glass where a plurality of the display devices 1000 are to be formed.

The buffer film may be formed via one of various deposition methods, such as a plasma enhanced chemical vapor deposition (PECVD) method, an atomic pressure CVD (APCVD) method, and a low pressure CVD (LPCVD) method, by using $SiO_2$ and/or $SiN_x$.

Figure 18:
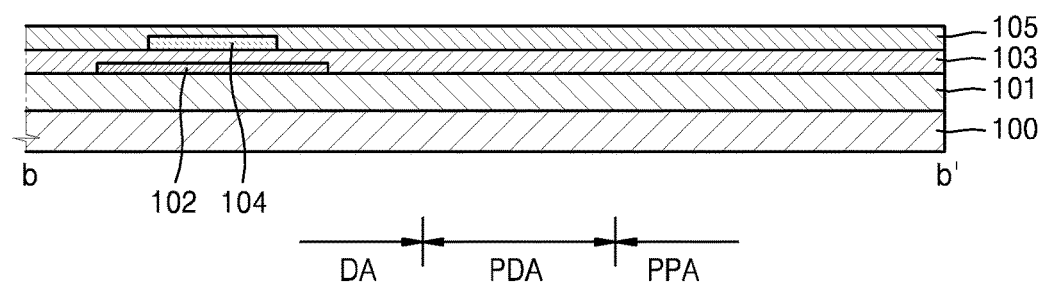

Referring to FIG. 18, a TFT is formed in the display area DA on the buffer film. The TFT formed on the display area DA operates as a part of a pixel circuit. Here, the TFT may also be formed on the non-display area NDA. The TFT formed on the non-display area NDA may operate as a part of a circuit included in a driver.

Herein, the TFT is a top gate type that includes an active layer 102, a gate electrode 104, and source and drain electrodes 106*s* and 106*d* sequentially from the buffer film. However, a type of the TFT is not limited thereto, and the TFT may be any one of various types, such as a bottom gate type.

The active layer 102 is formed on the buffer film, in a pattern shape. The active layer 102 includes a semiconductor material, for example, amorphous silicon or polycrystalline silicon. However, an embodiment of the present invention is not limited thereto, and the active layer 102 may include any one of various materials. In some embodiments, the active layer 102 may include an organic semiconductor material.

In some embodiments, the active layer 102 may include an oxide semiconductor material. For example, the active layer 102 may include G-I-Z-O[(In$_2$O$_3$)a(Ga$_2$O$_3$)b(ZnO)c], wherein a, b, and c are each a real number satisfying IDO, and c>0. The active layer 102 may include, aside from G-I-Z-O, for example, an oxide of a material selected from group 12, 13, and 14 metal elements, such as zinc (Zn), indium (In), gallium (Ga), tin (Sn), cadmium (Cd), germanium (Ge), and hafnium (Hf), or a combination thereof.

As described above, the current embodiment may include a TFT in any one of various shapes, for example, may include a TFT having a bottom gate structure. When the active layer 102 includes an oxide or amorphous silicon, the current embodiment may include the TFT having a bottom gate structure.

The TFT having a bottom gate structure may have any one of various shapes, for example, the gate electrode 104 may be formed on the substrate 100, the active layer 102 may be formed on the gate electrode 104, and the source and drain electrodes 106s and 106d may be arranged on the active layer 102. Alternatively, the gate electrode 104 may be formed on the substrate 100, the source and drain electrodes 106s and 106d may be formed on the gate electrode 104, and the active layer 102 may be formed on the source and drain electrodes 106s and 106d. In this case, an insulating film, for example, an inorganic film, may be formed to contact at least one of the gate electrode 104, the active layer 102, the source electrode 106s, and the drain electrode 106d.

The active layer 102 includes source and drain regions respectively contacting the source and drain electrodes 106s and 106d, and a channel region located between the source and drain regions. When the active layer 102 includes amorphous silicon or polycrystalline silicon, an impurity may be selectively doped on the source and drain regions.

A gate insulating layer 103 is formed on the active layer 102. The gate insulating layer 103 may be formed of a multilayer or single layer formed of an inorganic material, for example, silicon oxide and/or silicon nitride. The gate insulating layer 103 insulates the active layer 102 and the gate electrode 104 from each other.

The gate insulating layer 103 may be one layer forming the second inorganic pattern 102P, and may be formed on the entire central area CA of the substrate 100 including the display area DA, the non-display area NDA, and the pad area PDA, and the peripheral area PA around the cutting line CL including the pad peripheral area PPA. In other words, the gate insulating layer 103 may be formed on the entire substrate 100. Here, the substrate 100 may be the substrate 100 where one display device 1000 is formed, or a mother glass where a plurality of the display devices 1000 are formed.

The gate electrode 104 is formed on the gate insulating layer 103, in a pattern shape. The gate electrode 104 is coupled to a gate line for applying an on/off signal to the TFT. The gate electrode 104 may be formed of a low resistance metal material, for example, may be formed in a multilayer or single layer formed of a conductive material, such as molybdenum (Mo), aluminum (Al), copper (Cu), or titanium (Ti).

An interlayer dielectric film 105 is formed on the gate electrode 104. The interlayer dielectric film 105 insulates the source and drain electrodes 106s and 106d and the gate electrode 104 from each other. The interlayer dielectric film 105 may be formed in a multilayer or single layer formed of an inorganic material. For example, the inorganic material may be a metal oxide or a metal nitride, and the inorganic material may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and zinc oxide (ZrO$_2$).

The interlayer dielectric film 105 may be one layer forming the second inorganic pattern 102P, and may be formed on an entirety of the central area CA of the substrate 100 including the display area DA, the non-display area NDA, and the pad area PDA, and the peripheral area PA around the cutting line CL including the pad peripheral area PPA. In other words, the interlayer dielectric film 105 may be formed on the entire substrate 100. Here, the substrate 100 may be the substrate 100 where one display device 1000 is formed, or a mother glass where a plurality of the display devices 1000 are formed.

Figure 19:
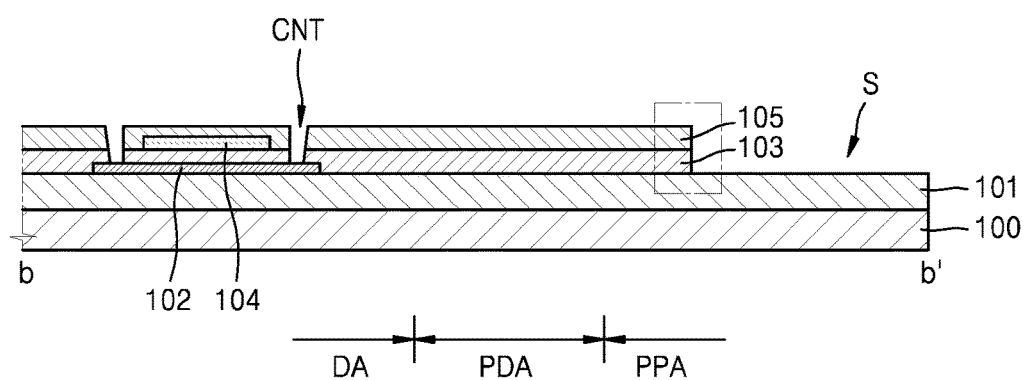

Then, referring to FIG. 19, a contact hole CNT is formed in the gate insulating layer 103 and the interlayer dielectric film 105, and at the same time, is patterned with respect to the peripheral area PA.

The contact hole CNT is formed such that a surface (e.g., a predetermined surface) of the active layer 102 is exposed. The contact hole CNT may later enable the source and drain electrodes 106s and 106d to be electrically coupled to the active layer 102. Meanwhile, while forming the contact hole CNT, removing the gate insulating layer 103 and the interlayer dielectric film 105 in the peripheral area PA and forming the insulating pattern IP in the pad peripheral area PPA are concurrently (e.g., simultaneously) performed. In other words, the gate insulating layer 103 and the interlayer dielectric film 105 in the peripheral area PA around the cutting line CL is also removed, and the slit S for forming the insulating pattern IP is formed in the pad peripheral area PPA. As such, according to an embodiment of the present invention, the manufacturing process may be simplified because a separate process for patterning the gate insulating layer 103 and the interlayer dielectric film 105 in the peripheral area PA may not be required.

Figure 20:
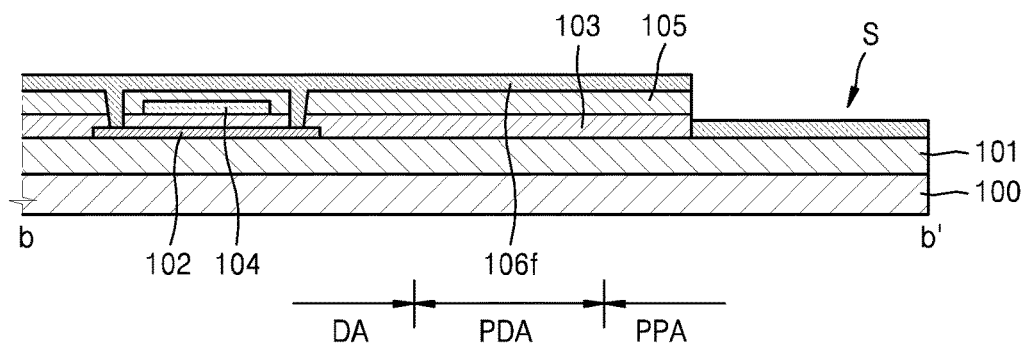

Referring to FIG. 20, a metal layer 106f, for forming the source and drain electrodes 106s and 106d, and the pad 106a is formed on the interlayer dielectric film 105. The metal layer 106f may be formed as multiple layers or as a single layer of a conductive material, such as Mo, Al, Cu, or Ti, of which electrical resistance is low.

Figure 21:
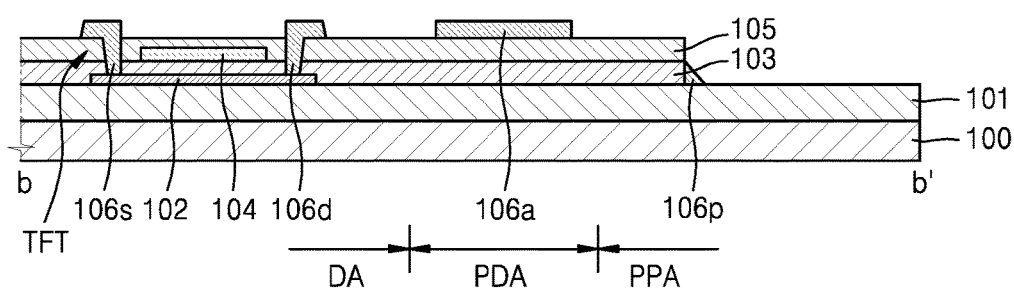

Then, referring to FIG. 21, the metal layer 106f is patterned to form the source and drain electrodes 106s and 106d, and the pad 106a. The source and drain electrodes 106s and 106d respectively contact the source and drain regions of the active layer 102 through the contact hole CNT formed in the interlayer dielectric film 105 and gate insulating layer 103. Also, the pad 106a is formed in the pad area PDA.

Meanwhile, a remaining metal film 106p may be left on side surfaces of inorganic films of the pad peripheral area PPA, for example, the gate insulating layer 103 and the interlayer dielectric film 105, if a metal layer is not completely removed. The remaining metal film 106p may generate a short circuit while bonding the circuit board 200 on which an external circuit is mounted to the pad 106a later.

Figure 22:
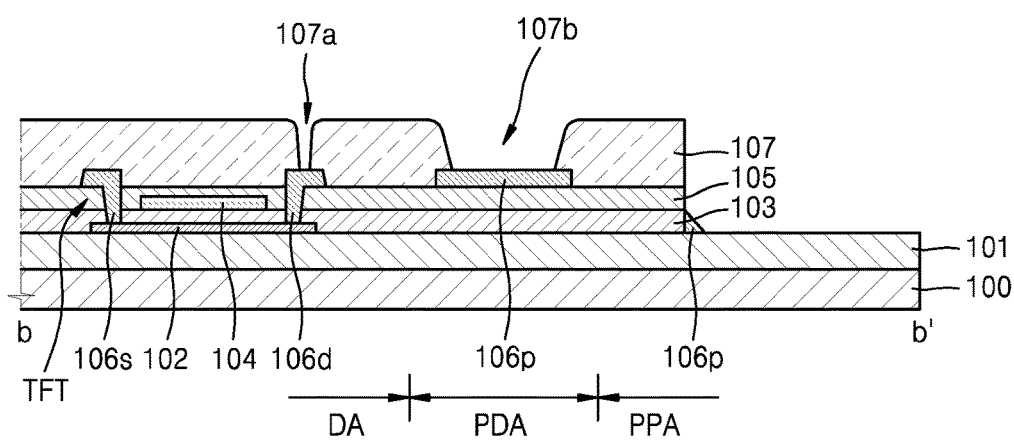

Referring to FIG. 22, a passivation film 107 is formed to cover the TFT.

The passivation film 107 resolves a stepped portion caused by the TFT and flattens the top surface of the TFT, thereby preventing a defect of an organic light-emitting device (OLED) caused by bottom unevenness. The passivation film 107 may be formed in a single layer or multilayer formed of an organic material. The organic material may include a general commercial polymer, such as polymethylmethacrylate (PMMA) or polystylene (PS), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, and a combination thereof. Alternatively, the passivation film 107 may be formed of a complex stacked body of an inorganic insulating film and an organic insulating film.

Then, the OLED is formed on the passivation film 107 referring to FIGS. 23 through 26.

A hole 107a that exposes one of the source and drain electrodes 106s and 106d, and an opening 107b that exposes the top surface of the pad 106a are formed in the passivation film 107. The hole 107a is a passage for electrically coupling the TFT and the OLED that is formed later. Meanwhile, the opening 107b is a passage for electrically coupling the pad 106a and the circuit board 200 on which an external circuit is mounted by exposing the pad 106a.

Next, the OLED is formed on the passivation film 107. The OLED includes a pixel electrode 111, a counter electrode 112 facing the pixel electrode 111, and an intermediate layer 113 between the pixel and counter electrodes 111 and 112. A display device is classified into a bottom emission type, a top emission type, and a dual emission type according to an emission direction of the OLED. In the bottom emission type, the pixel electrode 111 is a transmissive electrode and the counter electrode 112 is a reflective electrode. In the top emission type, the pixel electrode 111 is a reflective electrode and the counter electrode 112 is a semi-transmissive electrode. In the dual emission type, the pixel electrode 111 and the counter electrode 112 are both transmissive electrodes. In the current embodiment, an organic light-emitting display device is a top emission type.

Figure 23:
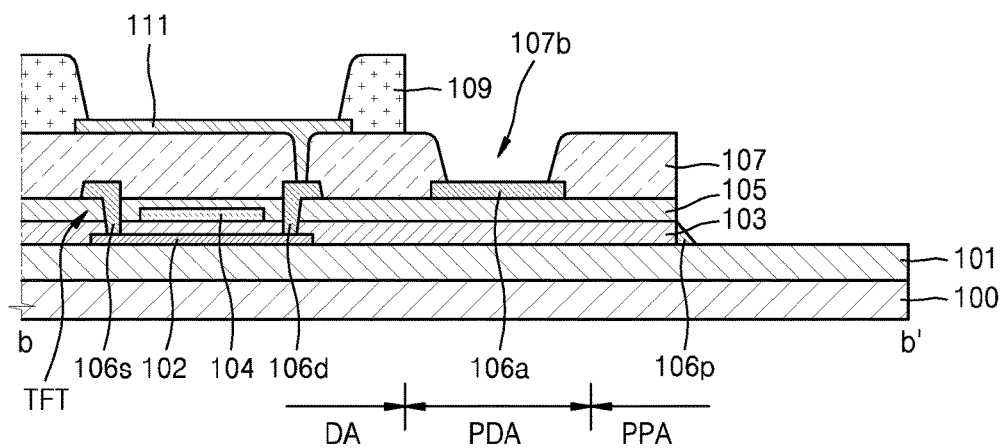

Referring to FIG. 23, the pixel electrode 111 may be patterned in an island shape. Also, the pixel electrode 111 contacts the TFT included in the pixel circuit through a hole of the passivation film 107. Meanwhile, the pixel electrode 111 may be formed to overlap the TFT such that the pixel circuit below the pixel electrode 111 is hidden.

The pixel electrode 111 includes a reflection electrode layer, as well as a transparent electrode layer, such that light may be reflected in a direction of the counter electrode 112. When the pixel electrode 111 operates as an anode, the transparent electrode layer may include at least one material selected from the group consisting of a transparent conductive oxide having a high work function, such as an indium tin oxide (ITO), an indium zinc oxide (IZO), a zinc oxide (ZnO), an indium oxide ($In_2O_3$), an indium gallium oxide (IGO), and an aluminum zinc oxide (AZO). The reflection electrode layer may include a metal having high reflectivity, such as silver (Ag).

Also, a pixel-defining film 109 is formed on the passivation film 107. The pixel-defining film 109 may be formed of at least one organic insulating material selected from the group consisting of polyimide, polyamide, acrylic resin, benzocyclobutene, and phenol resin, via a spin coating method or the like. The pixel-defining film 109 includes an opening 109a that covers an edge and opens at least a center portion of the pixel electrode 111. A region limited by the opening 109a corresponds to an emission region and the intermediate layer 113 is formed in the region.

Figure 24:
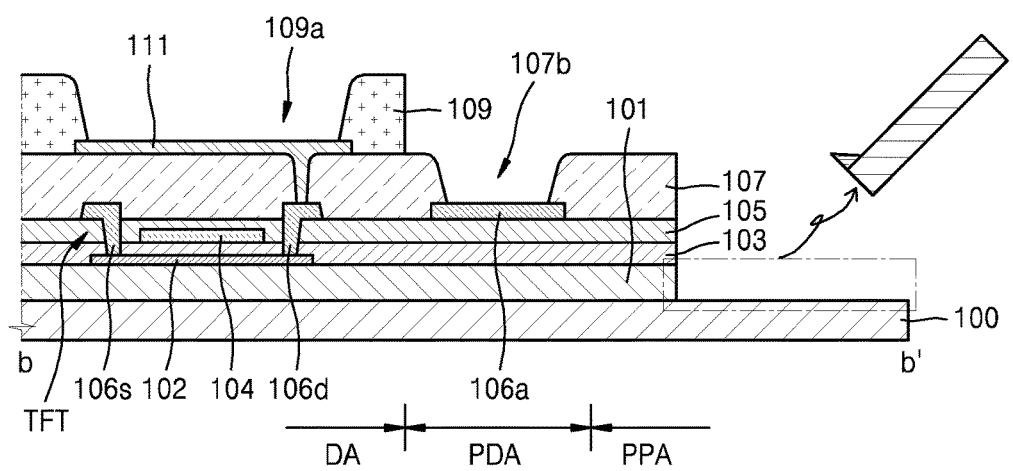

Then, referring to FIG. 24, the first inorganic film 101 in the peripheral area PA is patterned.

Although not illustrated, the first inorganic film 101 that is exposed around the cutting line CL is removed, and with respect to the pad peripheral area PPA, the first inorganic film 101 is removed so as to form the slit S that exposes the top surface of the substrate 100. Accordingly, in the pad peripheral area PPA, the insulating patterns IP each including the first inorganic pattern 101P and the second inorganic pattern 102P may be formed across the slit S where the substrate 100 is exposed.

While patterning the first inorganic film 101, side ends of the gate insulating layer 103 and the interlayer dielectric film 105 and a side end of the first inorganic film 101 may be matched. In this case, a remaining metal film on the side surface of the second inorganic pattern 102P may be removed while patterning the first inorganic film 101. As such, by removing the remaining metal film of the pad peripheral area PPA, a short circuit may be prevented (or substantially prevented), which may improve the reliability of the display device 1000.

In the current embodiment, the insulating pattern IP may be formed by using the first inorganic film 101 operating as a buffer film, the gate insulating layer 103, and the interlayer dielectric film 105. Although not illustrated, when the TFT according to the current embodiment has a bottom gate structure as described above, for example, when an active layer including an oxide semiconductor material is formed, the insulating pattern IP may be formed by using the first inorganic film 101 operating as a buffer film, a gate insulating layer to be located between an active layer and a gate electrode, and a passivation film that may be formed on source and drain electrodes.

Alternatively, the current embodiment may include the TFT having any one of various shapes, and in this case, the insulating pattern IP may be formed by extending an insulating layer in any one of various types, which is adjacent to or directly contacts an active layer, a gate electrode, and source and drain electrodes.

Figure 25:
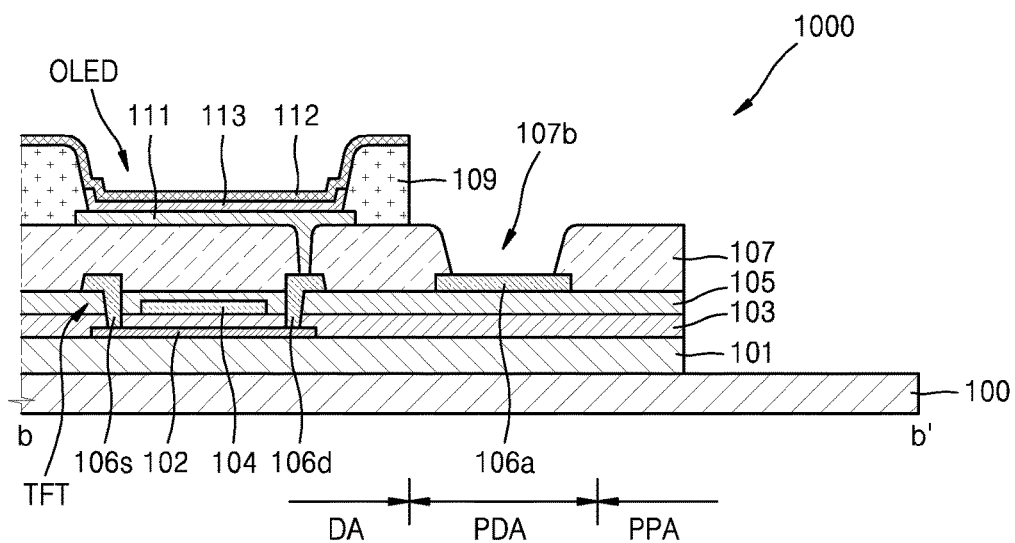

Then, referring to FIG. 25, the intermediate layer 113 is formed in the emission region. The intermediate layer 113 includes an organic emission layer emitting red, green, or blue light, wherein the organic emission layer may be formed of a low molecular organic material or a high molecular organic material. When the organic emission layer is a low molecular organic layer formed of a low molecular organic material, a hole transport layer (HTL) and a hole injection layer (HIL) are located in a direction of the pixel electrode 111, and an electron transport layer (ETL) and an electron injection layer (EIL) are stacked in a direction of the counter electrode 112 based on the organic emission layer. Here, any one of various layers other than an HTL, an HIL, an ETL, and an EIL may be further stacked if required.

Meanwhile, organic emission layers may be separately formed according to an organic light-emitting device. In this case, the organic emission layers may each emit red, green, or blue light according to an organic light-emitting device. However, an embodiment of the present invention is not limited thereto, and an organic emission layer may be commonly formed on an entire surface of an organic light-emitting device. For example, a plurality of organic emission layers emitting red, green, and blue lights may be perpendicularly stacked or mixed to emit a white light. Here, a combination of colors for emitting a white light is not limited to the above description. However, in this case, a color converting layer or a color filter for converting the white light into another color (e.g., a predetermined color) may be separately included.

Next, the counter electrode 112 is formed to cover an entire surface of the substrate 100. The counter electrode 112 may be formed of a conductive inorganic material. When the counter electrode 112 operates as a cathode, the counter electrode 112 may be formed of a metal having a low work function, such as lithium (Li), calcium (Ca), lithium fluoride/calcium (LiF/Ca), lithium fluoride/aluminum (LiF/Al), aluminum (Al), magnesium (Ag), or silver (Ag), or a thin film of the metals for light penetration. The counter electrode 112 may be formed as a common electrode on an entire surface of the display area DA where an image is realized. Here, the counter electrode 112 may be formed via an evaporation process that may not damage the intermediate layer 113. Meanwhile, polarities of the pixel electrode 111 and the counter electrode 112 may be switched with each other. The display device 1000 is finally completed by forming the counter electrode 112.

Although not illustrated, an insulating capping layer may be further formed on the counter electrode 112. The insulating capping layer may maintain a work function of the counter electrode 112 and prevent an organic material included in the intermediate layer 113 from being damaged while forming an encapsulation thin film via a sputtering process or a PECVD process. The insulating capping layer is a selective component and may not be included.

Then, although not illustrated, the OLED may be sealed by a sealing film to block external moisture or external air. The sealing film may have a thin film shape, wherein, for example, a film formed of an inorganic material, such as $SiO_x$ or $SiN_x$, and a film formed of an organic material, such as epoxy or polyimide, are alternately stacked on each other. However, alternatively, the sealing film may include a film formed of low melting glass.

By sealing the OLED by using the sealing film, the display device 1000 may have an overall flexible characteristic. Accordingly, the display device 1000 according to some embodiments of the present invention may be bent, folded, and rolled.

However, the current embodiment is not limited thereto, and a sealing member formed of any one of other various materials may be formed on the OLED.

Figure 26:
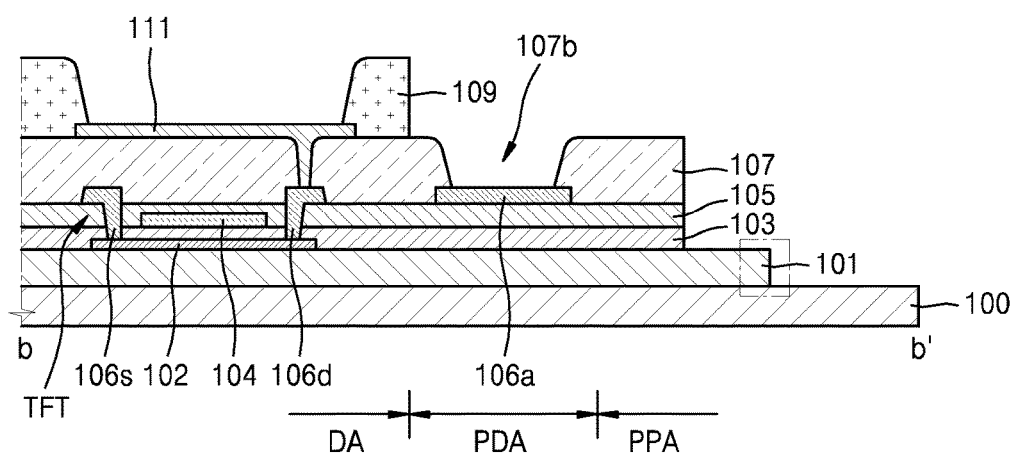
FIGS. 26 and 27 are cross-sectional views for describing a method of manufacturing the display device of FIG. 1 based on the line b-b' of FIG. 1, according to another embodiment of the present invention.
Figure 27:
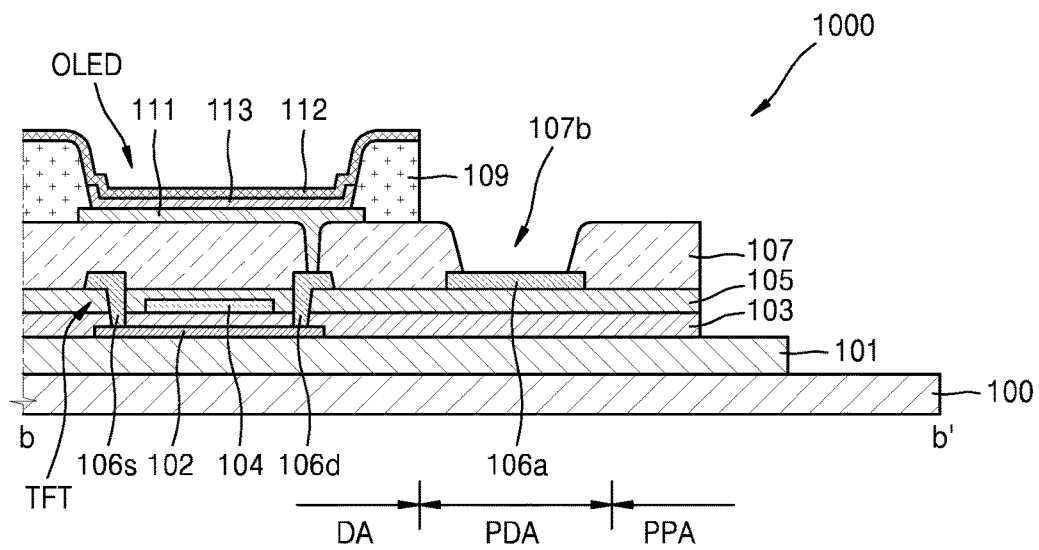

FIGS. 26 and 27 are cross-sectional views for describing a method of manufacturing the display device 1000 of FIG. 1 based on the line b-b' of FIG. 1, according to another embodiment of the present invention. In FIGS. 26 and 27, a process of manufacturing the insulating pattern IP according to an embodiment of FIG. 5 is included.

According to FIG. 26, while patterning the first inorganic film 101 in the peripheral area PA, the gate insulating layer 103 and the interlayer dielectric film 105 may not completely cover the top surface of the first inorganic film 101, i.e., the first inorganic film 101 may protrude farther than ends of the gate insulating layer 103 and the interlayer dielectric film 105.

Meanwhile, in a process of manufacturing the insulating pattern IP according to an embodiment of FIG. 6, a process of patterning the first inorganic film 101 is omitted from the method of FIGS. 17 through 25, and overlapping descriptions will not be repeated here.

Meanwhile, in a process of manufacturing the insulating pattern IP according to an embodiment of FIGS. 7 and 8, a process of patterning a part of the first inorganic film 101 is included in the method of FIGS. 17 through 25, and overlapping descriptions will not be repeated here.

FIGS. 28 through 31 are cross-sectional views for describing a method of manufacturing the display device 1000 of FIG. 1 based on the line b-b' of FIG. 1, according to another embodiment of the present invention. In FIGS. 28 through 31, a process of manufacturing the insulating pattern IP according to an embodiment of FIG. 10 is included.

Figure 28:
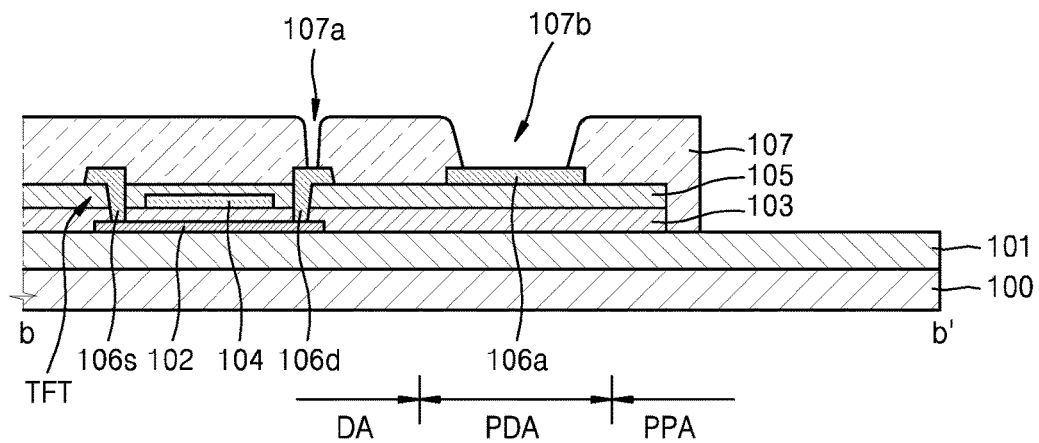
FIGS. 28 through 31 are cross-sectional views for describing a method of manufacturing the display device of FIG. 1 based on the line b-b' of FIG. 1, according to another embodiment of the present invention.

Referring to FIG. 28, while forming the passivation film 107, the passivation film 107 may also cover the top and side surfaces of the second inorganic pattern 102P in the pad peripheral area PPA. Accordingly, the remaining metal film that may be left on the side surface of the second inorganic pattern 102P may be covered by the passivation film 107, thereby preventing a short circuit.

Figure 29:
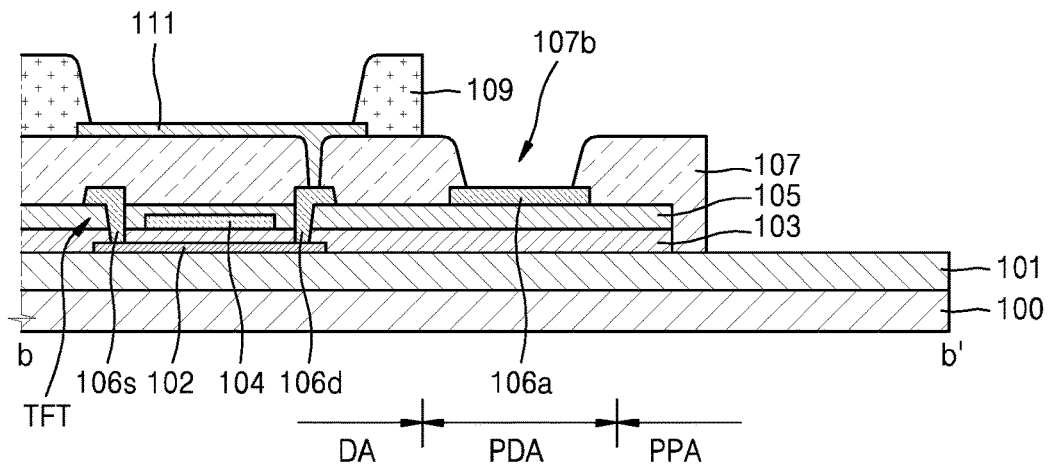
Figure 30:
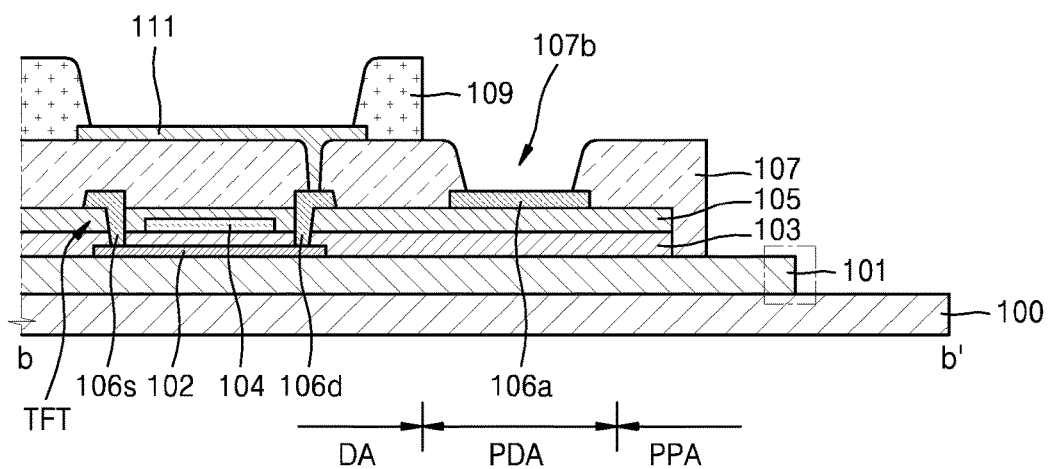
Figure 31:
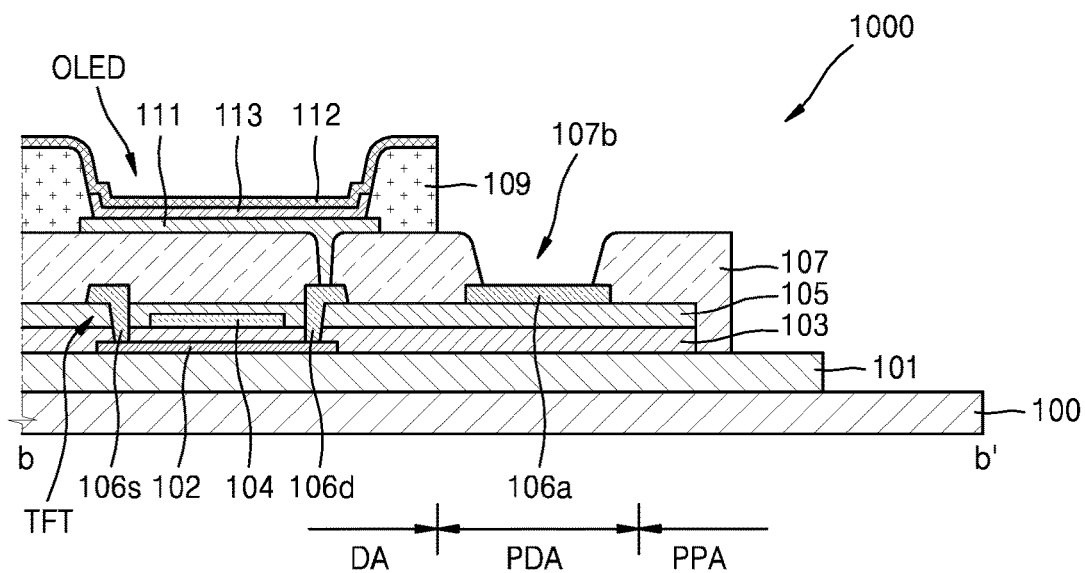

FIG. 29 illustrates a process of forming the pixel-defining film 109 like in FIG. 23, and FIG. 30 illustrates a process of patterning the first inorganic film 101 in the peripheral area PA like in FIG. 24. In FIG. 30, the side end surfaces of the gate insulating layer 103 and the interlayer dielectric film 105 and the side end surface of the first inorganic film 101 are patterned not to match each other, such that the top surface of the first inorganic film 101 is partially exposed, unlike in FIG. 24. FIG. 31 illustrates processes of forming the intermediate layer 113 and the counter electrode 112 like in FIG. 25.

Meanwhile, also in embodiments of FIGS. 9 and 11 through 14, processes of covering at least the second inorganic pattern 102P by the organic film 107P described above with reference to FIGS. 28 through 31 are further added, and overlapping descriptions are not repeated here.

Characteristics of the display device 1000 according to an embodiment of the present invention will now be described in more detail with reference to FIGS. 32 through 36.

Figure 33:
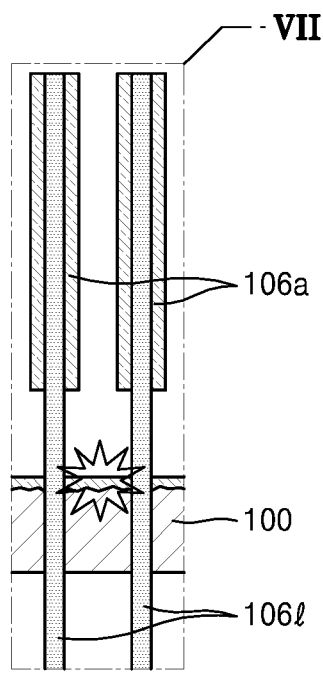
FIG. 33 is an enlarged plan view of the region VII of FIG. 32.

FIG. 32 is a plan view schematically illustrating the display device 1000 according to a comparative example. FIG. 33 is an enlarged plan view of a region VII of FIG. 32.

In FIG. 32, the circuit board 200 on which an external circuit is mounted is bonded to the pad 106a. On the circuit board 200, chips for transmitting various types of power or electric signals to the display area DA are mounted. The chips are not shown in FIG. 32. The circuit board 200 includes the wires 1061 for coupling the chips and the pads 106a of the substrate 100. Here, by bonding the wires 1061 to the pads 106a, various types of power or electric signals output from the chips may be transmitted to the display area DA through the pads 106a.

Referring to FIG. 33, when the insulating pattern IP and the slit S are not included in the pad peripheral area PPA, an impurity, a particle, or a remaining metal film remaining while forming a metal film may be left, and due to such a remaining metal film, the wires 1061 may be electrically shorted, thereby generating a short circuit.

Figure 34:
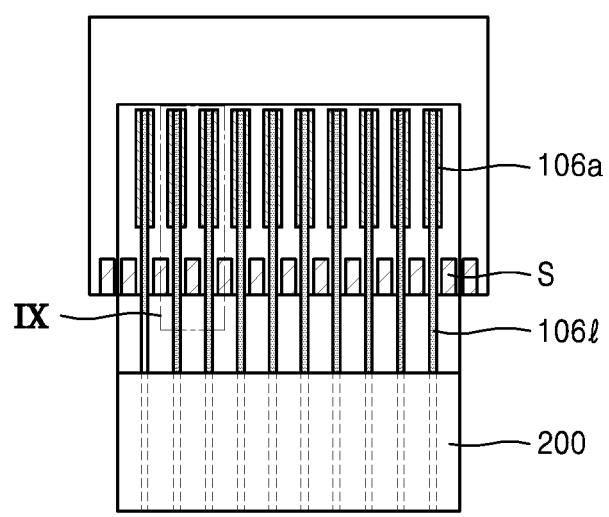
FIG. 34 is a plan view schematically illustrating a display device according to an embodiment of the present invention.
Figure 35:
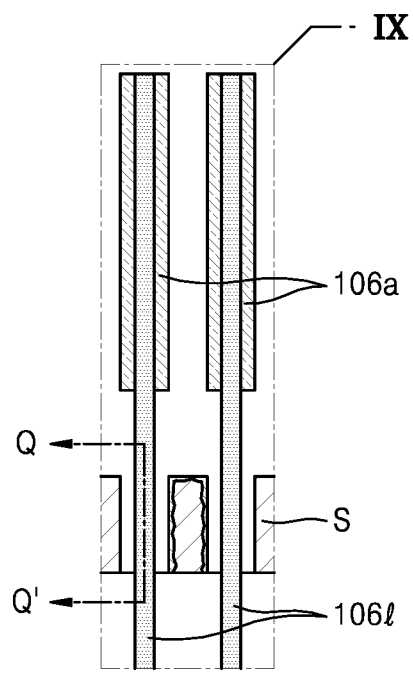
FIG. 35 is an enlarged plan view of the region IX of FIG. 34.
Figure 36:
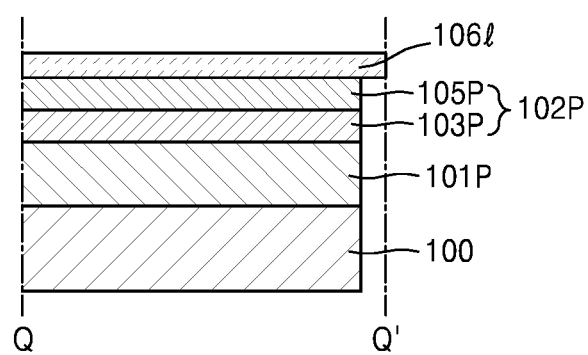
FIG. 36 is a cross-sectional view taken along the line Q-Q' of FIG. 35.

FIG. 34 is a plan view schematically illustrating the display device 1000 according to an embodiment of the present invention, FIG. 35 is an enlarged plan view of a region IX of FIG. 34, and FIG. 36 is a cross-sectional view taken along a line Q-Q' of FIG. 35.

Referring to FIGS. 34 and 36, the current embodiment is substantially similar to the comparative example in that the circuit board 200 includes the wires 1061, but is different from the comparative example in that the insulating pattern IP and the slit S are located in the pad peripheral area PPA of the substrate 100.

Referring to FIG. 35, because the insulating pattern IP and the slit S are arranged in the pad peripheral area PPA, even when a remaining metal film is left on a side surface of an inorganic film removed to form the slit S, the wires 1061 are not electrically shorted by the remaining metal film. In other words, the wires 1061 are arranged correspondingly to the insulating pattern IP or the slit S is arranged between the wires 1061. As shown in FIG. 36, the wires 1061 may extend on the insulating pattern IP, for example, on the second inorganic pattern 102P of the insulating pattern IP.

Accordingly, a short circuit, like in the comparative example, may not be generated.

As described above, according to the one or more of the above embodiments of the present invention, in a display device, a short defect is prevented (or substantially prevented) while bonding a circuit board on which an external circuit is mounted.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display device comprising:
   a central area having a display area on a substrate;
   a peripheral area around the central area;
   a plurality of pads in a pad area;
   a plurality of insulating patterns adjacent the plurality of pads and in a pad peripheral area between the plurality of pads and an edge of the substrate, the plurality of insulating patterns extending from the pad area to the edge of the substrate; and
   a slit between the plurality of insulating patterns in the peripheral area and extending to the edge of the substrate.

2. The display device of claim 1, wherein the plurality of pads each comprise an extension line, and wherein the plurality of insulating patterns overlap the extension lines.

3. The display device of claim 1, wherein the plurality of insulating patterns comprise an inorganic material.

4. The display device of claim 1, further comprising an organic film covering an uppermost surface and at least one region of a side surface of the plurality of insulating patterns.

5. The display device of claim 1, wherein the peripheral area comprises a region exposing a top surface of the substrate.

6. The display device of claim 5, wherein the peripheral area comprises a pad peripheral area adjacent to the plurality of pads and comprises the plurality of insulating patterns and the slit, and wherein the region exposing the top surface of the substrate is adjacent to the pad peripheral area.

7. The display device of claim 5, wherein the region exposing the top surface of the substrate is adjacent to an edge of the substrate.

8. The display device of claim 1, wherein an edge of the substrate is defined by a cutting line.

9. The display device of claim 1, wherein at least one inorganic film is in a central area of the substrate.

10. The display device of claim 9, wherein the plurality of insulating patterns have a shape coupled to the at least one inorganic film.

11. The display device of claim 9, wherein the plurality of pads are on the at least one inorganic film.

12. The display device of claim 9, wherein the at least one inorganic film comprises a plurality of layers.

13. The display device of claim 1, wherein the plurality of insulating patterns comprise a plurality of inorganic patterns stacked on each other.

14. The display device of claim 13, wherein the plurality of insulating patterns comprise a first inorganic pattern, and a second inorganic pattern on the first inorganic pattern.

15. The display device of claim 14, wherein a top surface of the first inorganic pattern is completely covered by the second inorganic pattern.

16. The display device of claim 14, wherein a top surface of the first inorganic pattern has an exposed region.

17. The display device of claim 14, further comprising an organic film covering at least a top surface and a side surface of the second inorganic pattern of the plurality of insulating patterns.

18. The display device of claim 1, wherein a first inorganic film is between the plurality of insulating patterns and the substrate.

19. The display device of claim 18, wherein a groove is formed in a region of the first inorganic film that is removed such that a groove is formed in a region of the first inorganic film overlapping the slit.

20. The display device of claim 18, further comprising an organic film covering at least a top surface and a side surface of the plurality of insulating patterns while not covering a portion of the first inorganic film corresponding to the slit.

21. The display device of claim 1, further comprising, in the central area:
   a buffer film on the substrate; and
   a plurality of thin-film transistors (TFTs) on the buffer film and comprising an active layer, a gate electrode, a source electrode, and a drain electrode,
   wherein at least one insulating film is adjacent to at least one of the active layer, the gate electrode, the source electrode, and the drain electrode, and
   the plurality of insulating patterns are a same material as the at least one insulating film.

22. The display device of claim 21, wherein the plurality of insulating patterns and the at least one insulating film are coupled to each other.

23. The display device of claim 21, wherein the at least one insulating film comprises at least one of a buffer film formed on the substrate, a gate insulating layer insulating the gate electrode and an active layer, or an interlayer dielectric film insulating the source and drain electrodes and the gate electrode.

24. The display device of claim 21, wherein the at least one insulating film comprises at least one of a buffer film formed on the substrate, a gate insulating layer insulating the gate electrode and an active layer, or a passivation film formed on the source and drain electrodes.

25. The display device of claim 21, further comprising an organic film covering the plurality of TFTs, wherein the organic film covers at least one region of an uppermost surface and a side surface of the plurality of insulating patterns.

26. The display device of claim 21, further comprising:
   a pixel electrode electrically coupled to at least one of the plurality of TFTs; and
   a pixel-defining film covering a portion of the pixel electrode and defining an emission region,
   wherein the pixel-defining film covers at least one region of an uppermost surface and a side surface of the plurality of insulating patterns.

27. The display device of claim 26, further comprising a counter electrode facing the pixel electrode,
   wherein an organic emission layer is between the pixel electrode and the counter electrode.

28. The display device of claim 1, wherein the substrate comprises a flexible material.

29. The display device of claim 1, further comprising:
   dummy insulating patterns spaced apart from the plurality of insulating patterns, wherein the dummy insulating patterns do not correspond to the plurality of pads; and
   a dummy slit between the dummy insulating patterns, wherein a portion of the dummy insulating patterns is removed in the peripheral area to form the dummy slit.

30. The display device of claim 1, wherein an angle formed by an extension line of the plurality of pads and an edge of the substrate is smaller or larger than 90° such that the plurality of pads have a slant shape, and an angle formed by an extension line of the slit and the edge of the substrate is smaller or larger than 90° such that the slit has a slant shape.

31. The display device of claim 30, wherein the angle formed by the extension line of the plurality of pads and the edge of the substrate is the same as the angle formed by the extension line of the slit and the edge of the substrate.

32. The display device of claim 1, further comprising a circuit board on which an external circuit is mounted such that an electric signal is transmitted to the display area,
wherein a plurality of wires of the circuit board are coupled to the plurality of pads.

33. The display device of claim 32, wherein the plurality of wires of the circuit board are on the plurality of insulating patterns, and are spaced apart from the slit.

* * * * *